(12) United States Patent
Tanaka et al.

(10) Patent No.: US 10,381,453 B2
(45) Date of Patent: Aug. 13, 2019

(54) METHOD FOR MANUFACTURING SILICON CARBIDE SEMICONDUCTOR DEVICE AND SILICON CARBIDE SEMICONDUCTOR DEVICE

(71) Applicant: Sumitomo Electric Industries, Ltd., Osaka-shi (JP)

(72) Inventors: So Tanaka, Osaka (JP); Shunsuke Yamada, Osaka (JP); Takahiro Matsui, Osaka (JP); Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/519,006

(22) PCT Filed: Sep. 7, 2015

(86) PCT No.: PCT/JP2015/075317
§ 371 (c)(1),
(2) Date: Apr. 13, 2017

(87) PCT Pub. No.: WO2016/059912
PCT Pub. Date: Apr. 21, 2016

(65) Prior Publication Data
US 2017/0243948 A1  Aug. 24, 2017

(30) Foreign Application Priority Data

Oct. 14, 2014  (JP) ................. 2014-209918

(51) Int. Cl.
*H01L 29/45* (2006.01)
*H01L 29/16* (2006.01)
(Continued)

(52) U.S. Cl.
CPC .......... *H01L 29/45* (2013.01); *H01L 21/0485* (2013.01); *H01L 29/1608* (2013.01);
(Continued)

(58) Field of Classification Search
None
See application file for complete search history.

(56) References Cited

U.S. PATENT DOCUMENTS

2011/0031506 A1  2/2011  Tamaso
2011/0031507 A1* 2/2011  Tamaso ............... H01L 21/0485
257/77

(Continued)

FOREIGN PATENT DOCUMENTS

| JP | 2014-038900 A | 2/2014 |
| WO | 2009/128382 A1 | 10/2009 |
| WO | 2009/128419 A1 | 10/2009 |

*Primary Examiner* — Herve-Louis Y Assouman
(74) *Attorney, Agent, or Firm* — Baker Botts L.L.P.; Michael A. Sartori

(57) ABSTRACT

A method for manufacturing a silicon carbide semiconductor device includes preparing a silicon carbide layer including an n-type region having an n conductivity type and a p-type region having a p conductivity type, forming a material layer containing titanium, aluminum, and silicon on the n-type region and the p-type region, and forming an electrode layer in contact with the n-type region and the p-type region by heating the material layer. In forming a material layer, composition of the material layer is determined such that a point (x, y, z) (x, y, and z each being a numeric value greater than 0) representing a composition ratio among titanium, aluminum, and silicon is included in a first triangular pyramidal region having four points of the origin (0, 0, 0), a point (1, 2, 2), a point (2, 1, 2) and a point (2, 2, 1) as vertices.

13 Claims, 36 Drawing Sheets

(51) Int. Cl.
*H01L 29/66* (2006.01)
*H01L 29/41* (2006.01)
*H01L 21/04* (2006.01)
*H01L 29/417* (2006.01)
*H01L 29/78* (2006.01)

(52) U.S. Cl.
CPC ...... *H01L 29/413* (2013.01); *H01L 29/41741* (2013.01); *H01L 29/66068* (2013.01); *H01L 29/7813* (2013.01)

(56) References Cited

U.S. PATENT DOCUMENTS

2011/0227096 A1* 9/2011 Wada .................. H01L 21/0445
257/77
2012/0132927 A1* 5/2012 Seki .................... H01L 21/0485
257/77

* cited by examiner

METHOD FOR MANUFACTURING SILICON CARBIDE SEMICONDUCTOR DEVICE AND SILICON CARBIDE SEMICONDUCTOR DEVICE

TECHNICAL FIELD

The present disclosure relates to a method for manufacturing a silicon carbide semiconductor device and a silicon carbide semiconductor device.

BACKGROUND ART

International Publication WO2009/128382 (PTD 1) discloses an ohmic contact electrode.

CITATION LIST

Patent Document

PTD 1: International Publication WO2009/128382

SUMMARY OF INVENTION

A method for manufacturing a silicon carbide semiconductor device according to one manner of the present disclosure includes preparing a silicon carbide layer including an n-type region having an n conductivity type and a p-type region having a p conductivity type, forming a material layer containing titanium, aluminum, and silicon on the n-type region and the p-type region, and forming an electrode layer in contact with the n-type region and the p-type region by heating the material layer. The material layer has a thickness not smaller than 10 nm. When a composition ratio among titanium, aluminum, and silicon contained in the material layer is represented by a point (x, y, z) (x, y, and z each being a numeric value greater than 0) in three-dimensional rectangular coordinates in which an X axis represents a ratio of the number of atoms of titanium, a Y axis represents a ratio of the number of atoms of aluminum, and a Z axis represents a ratio of the number of atoms of silicon, in forming a material layer, composition of the material layer is determined such that the point (x, y, z) is included in a first triangular pyramidal region having four points of the origin (0, 0, 0), a point (1, 2, 2), a point (2, 1, 2), and a point (2, 2, 1) as vertices.

A silicon carbide semiconductor device according to one manner of the present disclosure includes a silicon carbide layer including an n-type region having an n conductivity type and a p-type region having a p conductivity type, an electrode layer formed on the n-type region and the p-type region as being in contact with the n-type region and the p-type region, and a coating layer formed on the electrode layer. The electrode layer contains titanium, aluminum, silicon, and oxygen. Aluminum and oxygen are present at an interface between the electrode layer and the coating layer.

DESCRIPTION OF EMBODIMENTS

Description of Embodiment of Present Disclosure

Figure 1:
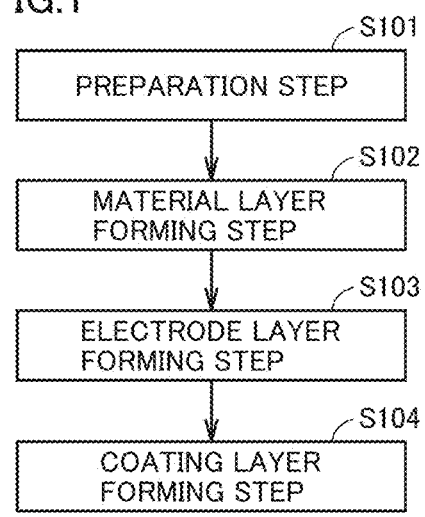
FIG. 1 is a flowchart showing overview of a method for manufacturing a silicon carbide semiconductor device according to one manner of the present disclosure.

An embodiment of the present disclosure will initially be listed and described.

In connection with performance of a semiconductor device, a contact resistance of an ohmic electrode is extremely important. In the field of a silicon carbide (SiC) semiconductor, an electrode material (such as nickel) in ohmic contact with an n-type region and an electrode material (such as aluminum) in ohmic contact with a p-type region have conventionally been known, and these are formed as separate electrodes because nickel (Ni) is in ohmic contact with the n-type region whereas it is less likely to be in ohmic contact with the p-type region. Similarly, aluminum (Al) is also less likely to be in ohmic contact with the n-type region.

With higher integration of an SiC semiconductor device in recent years, however, an n-type region and a p-type region are formed at positions proximate to each other and it is sometimes difficult to form separate electrodes in respective regions. In view of such circumstances, an electrode material which can be in ohmic contact with both of an n-type region and a p-type region has been demanded.

According to PTD 1, an electrode in ohmic contact with both of the n-type region and the p-type region can be formed by adopting an alloy containing titanium (Ti), aluminum (Al), and silicon (Si) for an electrode material. In a process for putting this electrode into practical use, however, the following problem was found.

In general, a contact resistance of an ohmic electrode is measured with a transfer length method using a circuit called a test element group (TEG) pattern provided in a semiconductor substrate (wafer) for fabricating an actual semiconductor device (also referred to as an "actual device"). Performance of an actual device is estimated based on a result of measurement for the TEG pattern.

A TEG pattern larger in area than an actual device has conventionally been used as a TEG pattern for ease in fabrication. In order to accurately predict performance of an actual device, however, a TEG pattern is desirably close in shape to an electrode of the actual device. Then, the present inventor has developed a TEG pattern the same in shape and area as an actual device (hereinafter also denoted as a "small pattern") and measured a contact resistance. Then, it has been found that even though a resistance is low in measurement for a conventional TEG pattern (hereinafter also denoted as a "large pattern"), a resistance can be high in measurement for a small pattern. It is estimated that a result of measurement for a small pattern better reflects performance of an actual device. When a contact resistance obtained with a TEG pattern is thus lower than a contact resistance of an actual device, it is difficult to predict performance with the use of a TEG pattern and reliability in guarantee of performance, for example, by using a TEG pattern becomes lower.

Measurement per se of a contact resistance can be conducted also with the use of an actual device. Measurement, however, is conducted in a process subsequent to a manufacturing process, which is disadvantageous in quick feedback to the manufacturing process because time has elapsed since formation of an electrode. In addition, since an area of an electrode is also small, accuracy in measurement tends to be low. Therefore, an electrode of which performance can be ensured based on a result of measurement for a TEG pattern is desirable.

Therefore, an object is to provide a silicon carbide semiconductor device including an electrode layer in ohmic contact with both of an n-type region and a p-type region and low in area dependency of a contact resistance.

[1] A method for manufacturing a silicon carbide semiconductor device according to one manner of the present disclosure includes preparing a silicon carbide layer 100 including an n-type region 14 having an n conductivity type and a p-type region 18 having a p conductivity type (S101), forming a material layer 101 containing titanium (Ti), aluminum (Al), and silicon (Si) on n-type region 14 and p-type region 18 (S102), and forming an electrode layer 102 in contact with n-type region 14 and p-type region 18 by heating material layer 101 (S103). Material layer 101 has a thickness not smaller than 10 nm. When a composition ratio among titanium, aluminum, and silicon contained in material layer 101 is represented by a point (x, y, z) (x, y, and z each being a numeric value greater than 0) in three-dimensional rectangular coordinates in which an X axis represents a ratio of the number of atoms of titanium, a Y axis represents a ratio of the number of atoms of aluminum, and a Z axis represents a ratio of the number of atoms of silicon, in forming material layer 101 (S102), composition of material layer 101 is determined such that the point (x, y, z) is included in a first triangular pyramidal region 91 having four points of the origin (0, 0, 0), a point (1, 2, 2), a point (2, 1, 2), and a point (2, 2, 1) as vertices.

The present inventor has found that an electrode layer in ohmic contact with both of the n-type region and the p-type region and low in area dependency of a TEG pattern (that is, area dependency of a contact resistance) can be formed by forming a material layer of which ratio of the number of atoms among Ti, Al, and Si satisfies a specific condition and heating (annealing) the material layer.

Figure 8:
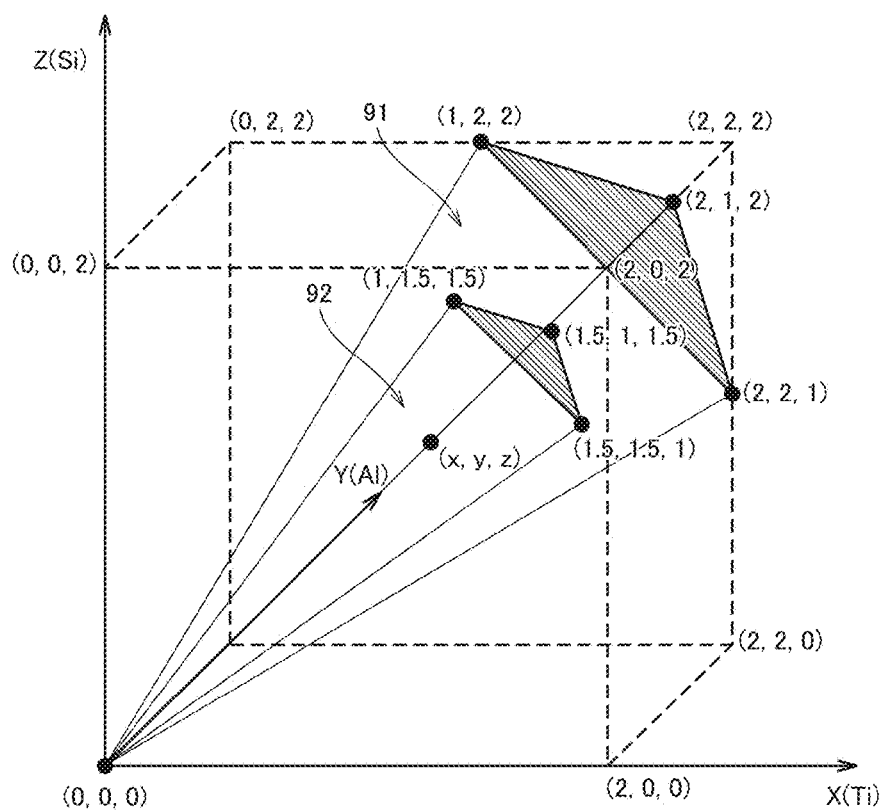
FIG. 8 is a diagram for illustrating composition of a material layer.

FIG. 8 shows three-dimensional rectangular coordinates in which an X axis represents a ratio of the number of atoms of Ti, a Y axis represents a ratio of the number of atoms of Al, and a Z axis represents a ratio of the number of atoms of Si. In the manufacturing method above, a composition ratio of (Ti, Al, Si) is determined so as to be included in first triangular pyramidal region 91 shown in FIG. 8. Furthermore, in the manufacturing method above, material layer 101 has a thickness not smaller than 10 nm. When material layer 101 has a thickness (an original thickness of electrode layer 102) smaller than 10 nm, a thickness of electrode layer 102 is less likely to be uniform and such a disadvantage as exposure of a base is caused. By heating material layer 101 satisfying the condition above, electrode layer 102 in ohmic contact with both of n-type region 14 and p-type region 18 and low in area dependency of a TEG pattern can be formed. "Being low in area dependency of a TEG pattern" means, for example, that variation in contact resistance is within one order of magnitude even when a width of an electrode of a TEG pattern varies between 1 μm and 100 μm.

[2] Forming material layer 101 (S102) can also include stacking a titanium layer, an aluminum layer, and a silicon layer. According to such a manner, for example, a ratio of the number of atoms among Ti, Al, and Si can be controlled based on a thickness of each layer and an operation is simplified.

[3] Material layer 101 may have a thickness not smaller than 50 nm and not greater than 500 nm. By restricting a thickness of material layer 101 in such a range, electrode layer 102 high in uniformity in thickness and low in contact resistance can be formed.

[4] In forming electrode layer 102 (S103), material layer 101 may be heated to a temperature not lower than 800° C. and not higher than 1200° C. in order to obtain satisfactory ohmic contact.

[5] In forming material layer 101 (S102), composition of material layer 101 may be determined such that the point (x, y, z) is included in a second triangular pyramidal region 92 having four points of the origin (0, 0, 0), a point (1, 1.5, 1.5), a point (1.5, 1, 1.5), and a point (1.5, 1.5, 1) as vertices. Balance between a contact resistance against n-type region 14 and a contact resistance against p-type region 18 is thus improved.

[6] A silicon carbide semiconductor device according to one manner of the present disclosure includes silicon carbide layer 100 including n-type region 14 having an n conductivity type and p-type region 18 having a p conductivity type, electrode layer 102 formed on n-type region 14 and p-type region 18 as being in contact with n-type region 14 and p-type region 18, and a coating layer 103 formed on electrode layer 102. Electrode layer 102 contains titanium, aluminum, silicon, and oxygen (O). Aluminum and oxygen are present at an interface 82 between electrode layer 102 and coating layer 103.

Electrode layer 102 obtained by heating material layer 101 containing Ti, Al, and Si as well as O and having an element distribution in which O and Al are segregated at a surface layer in a direction of thickness of the electrode layer can be in ohmic contact with both of n-type region 14 and p-type region 18 and low in area dependency of a TEG pattern.

"Al and O being present at interface 82" is confirmed by conducting surface analysis of a cross-section of electrode layer 102 in a direction of thickness with scanning transmission electron microscope-energy dispersive X-ray spectrometry (STEM-EDX).

Figure 36:
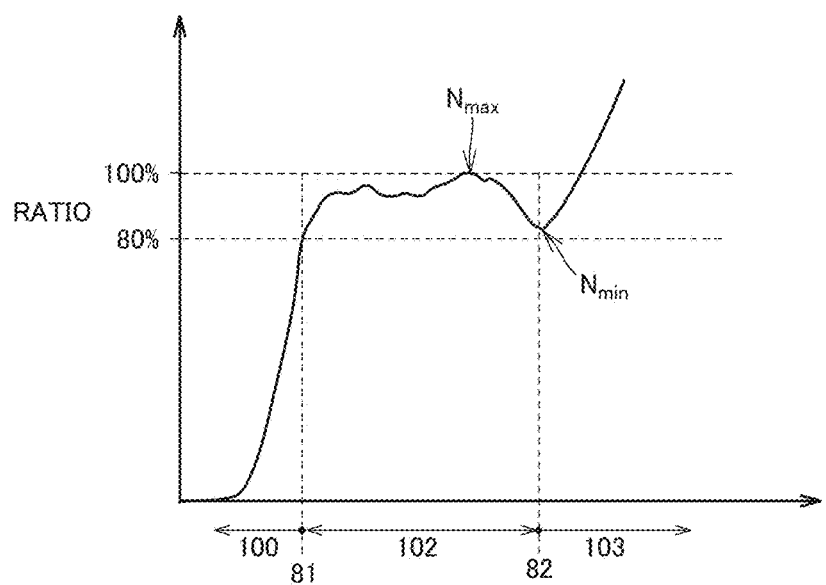
FIG. 36 is a graph schematically showing one example of transition of an atom concentration of Ti in the direction of thickness of the electrode layer.

The "interface between the electrode layer and the SiC layer or the coating layer" is defined as follows. Initially, a cross-section in the direction of thickness is analyzed with STEM-EDX, and a graph is prepared in which the abscissa represents a direction from the inside of SiC layer 100 through electrode layer 102 to the inside of coating layer 103 and the ordinate represents an atom concentration of each detected element (see, for example, FIG. 18). A relative maximum value ($N_{max}$) of an atom concentration of Ti in electrode layer 102 is extracted from the graph. Then, transition of the atom concentration of Ti is traced from the inside of SiC layer 100 toward the inside of coating layer 103, and a position where the atom concentration of Ti exceeds 80% of the relative maximum value ($N_{max}$) for the first time is defined as an "interface 81 between electrode layer 102 and SiC layer 100." Furthermore, a position where the atom concentration of Ti is again lower than 80% of the relative maximum value ($N_{max}$) beyond a position of the relative maximum value ($N_{max}$) in transition of the atom concentration of Ti is defined as "interface 82 between electrode layer 102 and coating layer 103." As shown in FIG. 36, however, the atom concentration of Ti may increase under the influence by coating layer 103 (for example, a titanium nitride layer) without lowering to 80% of the relative maximum value ($N_{max}$) beyond the position where the relative maximum value ($N_{max}$) is exhibited. In this case, a position where the atom concentration of Ti starts to increase after decrease (a relative minimum value ($N_{min}$) in FIG. 36) is defined as "interface 82 between electrode layer 102 and coating layer 103."

The "inside of electrode layer 102" means a portion between interface 81 and interface 82 thus defined.

[7] An atom concentration of aluminum in the inside of electrode layer 102 may be lower than an atom concentration of aluminum at interface 82 between electrode layer 102 and coating layer 103. Electrode layer 102 having such an element distribution is lower in contact resistance.

[8] A concentration of oxygen in the inside of electrode layer 102 may be lower than a concentration of oxygen at interface 82 between electrode layer 102 and coating layer 103. Electrode layer 102 having such an element distribution is lower in contact resistance.

[9] Coating layer 103 may be a barrier metal layer or a metal interconnection layer, because a state that Al and O are segregated at interface 82 between electrode layer 102 and coating layer 103 is readily achieved.

[10] An average value of a thickness of electrode layer 102 may be not smaller than 50 nm and not greater than 500 nm, because a thickness is uniform and a contact resistance is lowered.

Figure 34:
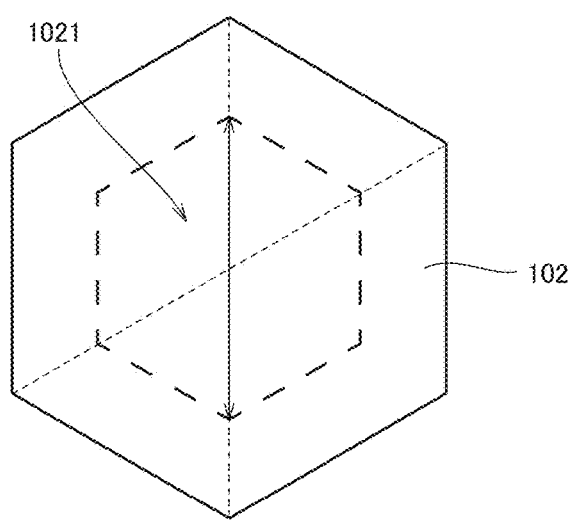
FIG. 34 is a schematic diagram illustrating a method of measuring an average value of a thickness of the electrode layer.
Figure 35:
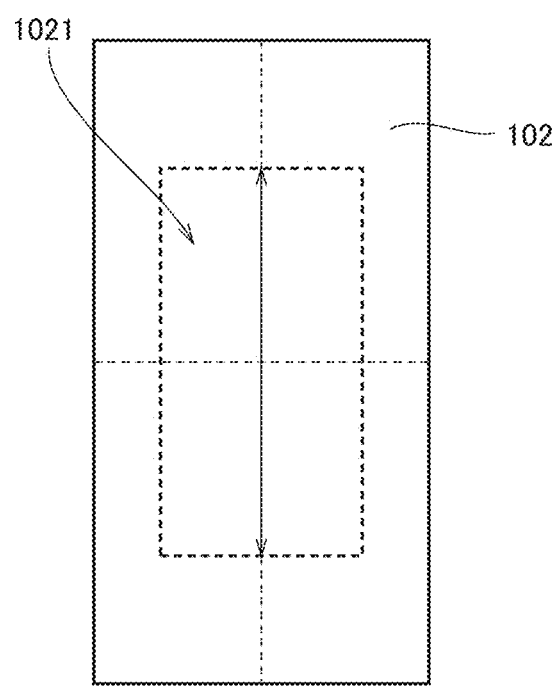
FIG. 35 is a schematic diagram illustrating the method of measuring an average value of a thickness of the electrode layer.

An average value ($T_{ave}$) of a thickness of electrode layer 102 is measured as follows. Initially, in a plan view of electrode layer 102 (a field of view in a direction of normal to a surface of electrode layer 102), a measurement region 1021 which includes the center of gravity of electrode layer 102, is similar in shape to an outer shape of electrode layer 102, and has an area at least 0.25 time as large as electrode layer 102 is set (see FIGS. 34 and 35). Then, a cross-section perpendicular to the surface of electrode layer 102 is obtained so as to include a straight line dividing the area of measurement region 1021 in half, a thickness is measured at 12 or more positions at an interval of 0.1 μm in the cross-section (see FIG. 31), and an average value ($T_{ave}$) as well as a maximum value ($T_{max}$) and a minimum value ($T_{min}$) of the thickness of the electrode layer are found.

[11] Relation of $(T_{max}-T_{min})/T_{ave} \leq 1.0$ may be satisfied, where $T_{max}$ represents a maximum value of a thickness of the electrode layer, $T_{min}$ represents a minimum value of the thickness of the electrode layer, and $T_{ave}$ represents the average value of the thickness of the electrode layer. "$(T_{max}-T_{min})/T_{ave}$" is an indicator of uniformity in thickness, and a smaller value thereof indicates high uniformity in thickness. By controlling $(T_{max}-T_{min})/T_{ave}$ to 1.0 or smaller, a contact resistance can be lowered.

[12] An atom concentration of carbon (C) at interface 81 between silicon carbide layer 100 and electrode layer 102 may be not higher than 10%. With a large amount of C at interface 81, ohmic contact between electrode layer 102 and SiC layer 100 may be interfered. With an atom concentration of C at interface 81 being 10% or lower, satisfactory ohmic contact can be established.

[13] An average value of an atom concentration of carbon in the inside of electrode layer 102 may be not higher than 10%.

$Ti_3SiC_2$ has conventionally been known as electrode composition which is likely to establish ohmic contact with p-type region 18. An electrode composed of $Ti_3SiC_2$ seems to have an average value of an atom concentration of C around 33%. According to the studies conducted by the present inventor, however, in electrode layer 102 in ohmic contact not only with p-type region 18 but also with n-type region 14, C is contained in the electrode desirably as little as possible. With an average value of an atom concentration of C in the inside of electrode layer 102 being 10% or lower, an electrode layer in ohmic contact with both of n-type region 14 and p-type region 18 and low in contact resistance against both of them can be formed.

Details of Embodiment of Present Disclosure

One embodiment of the present disclosure (hereinafter denoted as the "present embodiment") will be described below in detail. Though a metal oxide semiconductor field effect transistor (MOSFET) having a trench gate structure will be described by way of example below, the present embodiment is not limited thereto and the present embodiment is applicable to every semiconductor device so long as an electrode layer in ohmic contact with both of the n-type region and the p-type region is provided.

[Method for Manufacturing Silicon Carbide Semiconductor Device]

FIG. 1 is a flowchart showing overview of a manufacturing method in the present embodiment. As shown in FIG. 1, the manufacturing method in the present embodiment includes a preparation step (S101), a material layer forming step (S102), an electrode layer forming step (S103), and a coating layer forming step (S104). Each step will be described below.

[Preparation Step (S101)]

In the preparation step (S101), silicon carbide (SiC) layer 100 including n-type region 14 having the n conductivity type and p-type region 18 having the p conductivity type is prepared.

A process for forming SiC layer 100 will be described with reference to FIGS. 2 to 5. Initially, a single-crystal substrate 11 is prepared. Single-crystal substrate 11 is composed, for example, of SiC single crystal having a polytype 4H. Then, an epitaxial layer to be a drift layer 12 is grown on single-crystal substrate 11. For example, chemical vapor deposition (CVD) is used for growing the epitaxial layer.

Figure 2:
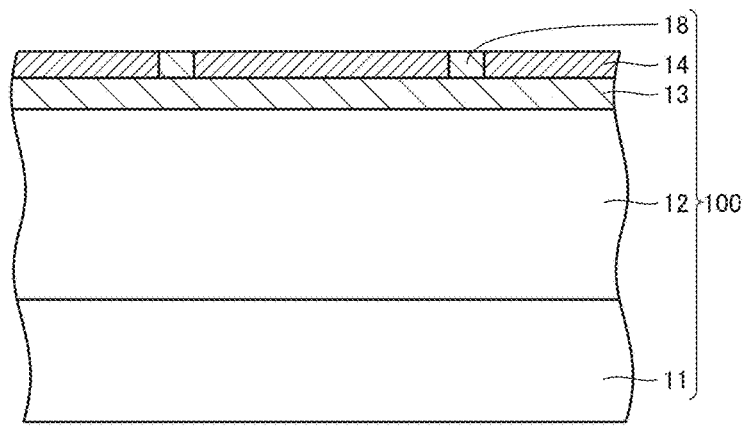
FIG. 2 is a schematic cross-sectional view illustrating a part of a preparation step.

Then, a body region 13 having the p conductivity type, n-type region 14 (an $n^+$ region) having the n conductivity type, and p-type region 18 (a contact region) having the p conductivity type are formed in the epitaxial layer (drift layer 12) as shown in FIG. 2, by implanting ions with the use of an implantation mask (not shown). An amount of implantation of an impurity into each region should only be adjusted as appropriate in accordance with aimed specifications of a semiconductor device.

Figure 3:
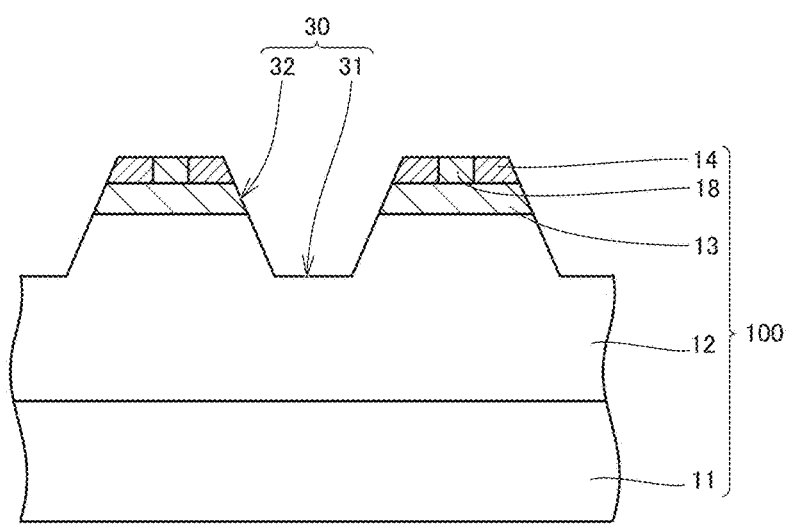
FIG. 3 is a schematic cross-sectional view illustrating a part of the preparation step.
Figure 4:
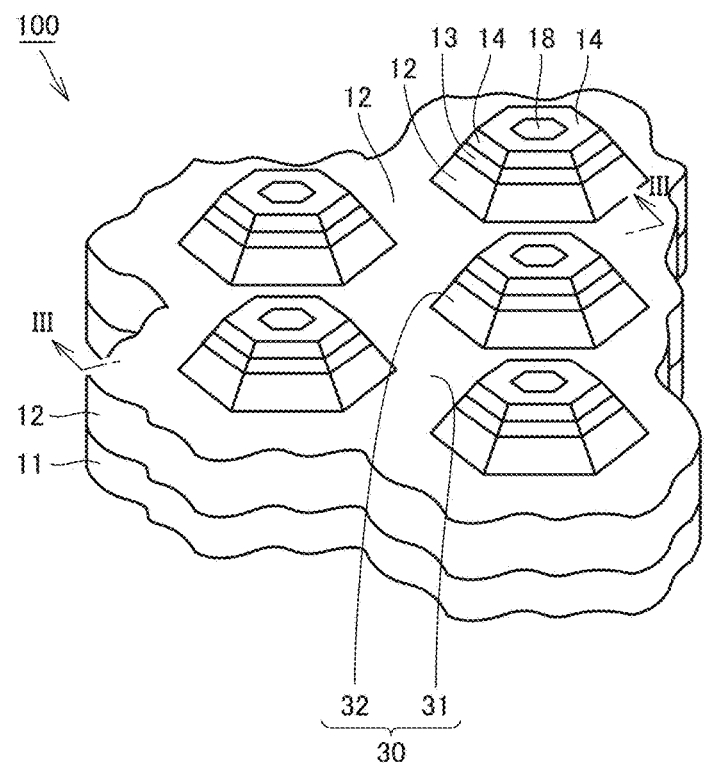
FIG. 4 is a schematic diagram illustrating a surface shape of a silicon carbide layer.

Then, a trench 30 shown in FIG. 3 is provided by successively performing reactive ion etching (RIE) and thermal etching. Trench 30 includes a sidewall 32 which passes through n-type region 14 and body region 13 and reaches drift layer 12 and a bottom portion 31 located on drift layer 12. FIG. 4 is a schematic diagram illustrating a surface shape of SiC layer 100 having trench 30 provided. As shown in FIG. 4, trench 30 is provided to exhibit a mesh in a honeycomb structure. Sidewall 32 defines an inclined surface of a mesa in a form of a frustum of a hexagonal pyramid. In a plan view, a top surface of the mesa is hexagonal and n-type region 14 and p-type region 18 are exposed at the top surface.

Figure 5:
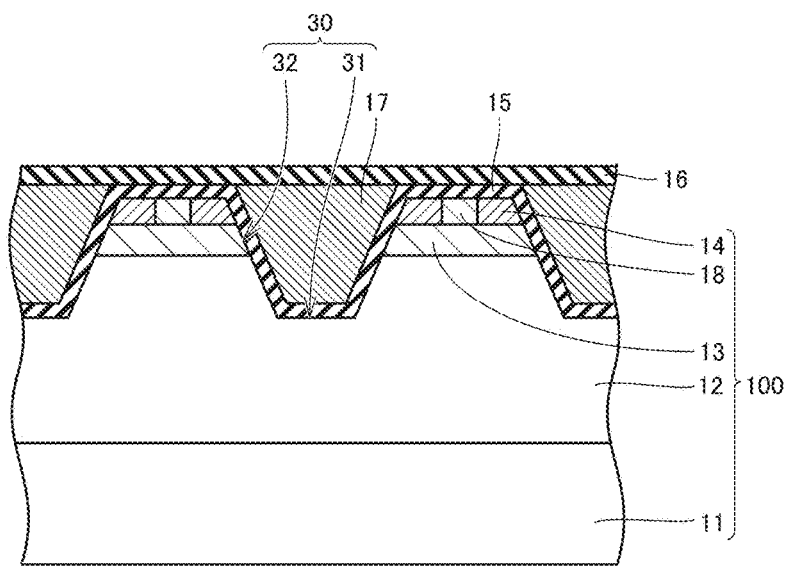
FIG. 5 is a schematic cross-sectional view illustrating a part of the preparation step.

Thereafter, as shown in FIG. 5, a gate insulating film 15 and a gate electrode 17 are formed in trench 30, and an interlayer insulating film 16 is further formed to cover gate electrode 17. Gate insulating film 15 and interlayer insulating film 16 are composed, for example, of silicon dioxide ($SiO_2$) and gate electrode 17 is composed, for example, of polysilicon.

[Material Layer Forming Step (S102)]

Figure 6:
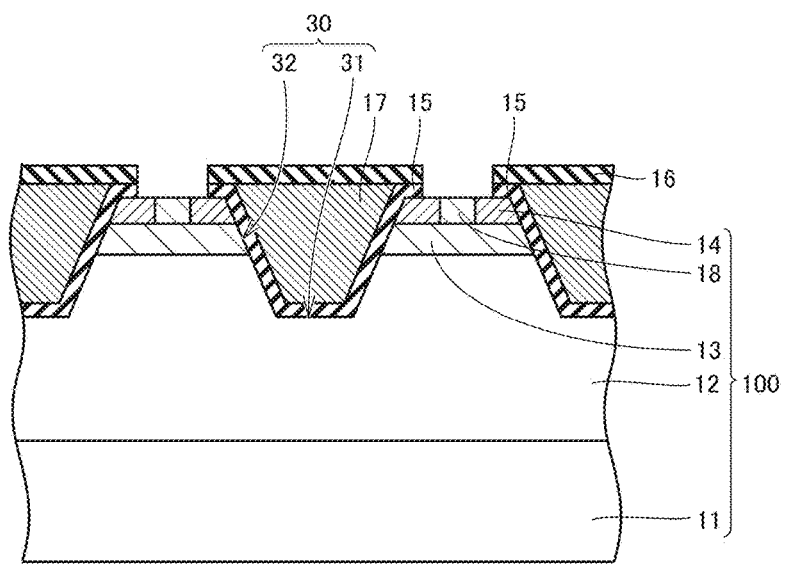
FIG. 6 is a schematic cross-sectional view illustrating a material layer forming step.

In the material layer forming step (S102), material layer 101 containing Ti, Al, and Si is formed on n-type region 14 and p-type region 18. As shown in FIG. 6, initially, an opening hexagonal in a plan view is provided, for example, with RIE, in a portion of interlayer insulating film 16 where material layer 101 is to be formed, so that n-type region 14 and p-type region 18 are exposed.

Figure 7:
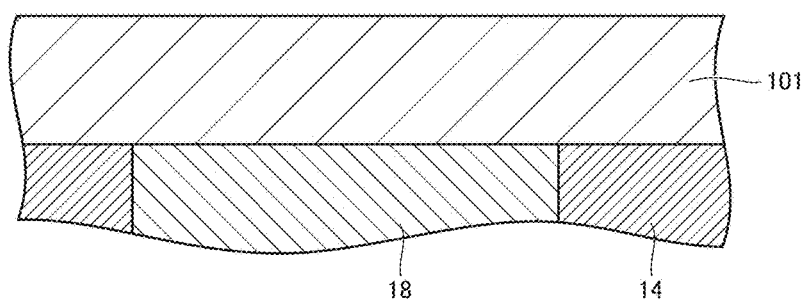
FIG. 7 is a schematic cross-sectional view illustrating the material layer forming step.

Then, as shown in FIG. 7, for example, with sputtering, material layer 101 containing Ti, Al, and Si is formed on n-type region 14 and p-type region 18. For example, with sputtering using an alloy target containing Ti, Al, and Si, material layer 101 containing Ti, Al, and Si can be formed.

In the present embodiment, a ratio of the number of atoms among the elements is adjusted such that material layer 101 has specific composition. FIG. 8 shows three-dimensional rectangular coordinates in which the X axis represents a ratio of the number of atoms of Ti, the Y axis represents a ratio of the number of atoms of Al, and the Z axis represents a ratio of the number of atoms of Si. In the coordinates, a composition ratio among Ti, Si, and Al in material layer 101 is expressed with a point (x, y, z). X, y, and z are each a numeric value greater than 0 (zero).

In the present embodiment, a composition ratio of material layer 101 is determined within a first triangular pyramidal region 91 having four points of the origin (0, 0, 0), a point (1, 2, 2), a point (2, 1, 2), and a point (2, 2, 1) as vertices. Thus, electrode layer 102 simultaneously in ohmic contact with n-type region 14 and p-type region 18 and low in area dependency of a TEG pattern can be formed.

A composition ratio among Ti, Si, and Al in material layer 101 is preferably determined to be included in a second triangular pyramidal region 92 having four points of the origin (0, 0, 0), a point (1, 1.5, 1.5), a point (1.5, 1, 1.5), and a point (1.5, 1.5, 1) as vertices. Thus, balance between a contact resistance against n-type region 14 and a contact resistance against p-type region 18 is improved.

Material layer 101 should have a thickness not smaller than 10 nm. With a thickness smaller than 10 nm, even though the composition above is satisfied, variation in thickness is great in forming electrode layer 102 by heating, and in a portion extremely small in thickness, such a disadvantage as exposure of underlying SiC layer 100 may take place. This may be because Al and Si contained in material layer 101 exhibit a relatively high vapor pressure in a temperature zone up to a heating temperature at the time of formation of an electrode, these elements evaporate from a surface layer during heating, and a rate of evaporation at each position in an in-plane direction is also varied.

Material layer 101 has a thickness preferably not smaller than 50 nm and more preferably not smaller than 50 nm and not greater than 500 nm. With material layer 101 having such a thickness, uniformity in thickness of electrode layer 102 is improved. Material layer 101 has a thickness particularly preferably not smaller than 100 nm and not greater than 300 nm.

Figure 9:
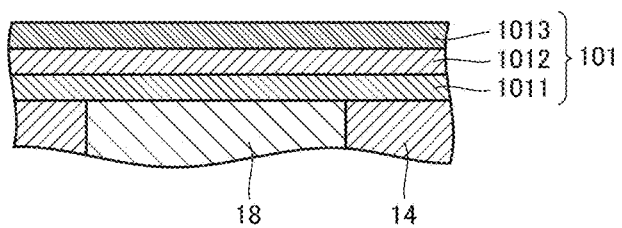
FIG. 9 is a schematic cross-sectional view illustrating the material layer forming step.

Material layer 101 may be formed in one step with sputtering by using an alloy target as described previously or by stacking a Ti layer 1011, an Al layer 1012, and an Si layer 1013 as shown in FIG. 9. According to such a manner, a ratio of the number of atoms (composition ratio) among Ti, Al, and Si can be controlled based on a thickness of each layer. In the present embodiment, a composition ratio (x, y, z) among Ti, Al, and Si in a material layer obtained by stacking a Ti layer having a thickness of 20 nm, an Al layer having a thickness of 30 nm, and an Si layer having a thickness of 30 nm is set to (1, 1, 1).

Though an order of stack of each layer is not particularly limited, the Ti layer, the Al layer, and the Si layer are desirably stacked in this order from a side of SiC layer 100. Since Si is less likely to be oxidized than Ti and Al, oxidation of Ti and Al can be suppressed by stacking the layers in such an order. Though a thickness of each layer is not particularly restricted either, the thickness is preferably not smaller than 10 nm.

[Electrode Layer Forming Step (S103)]

Figure 10:
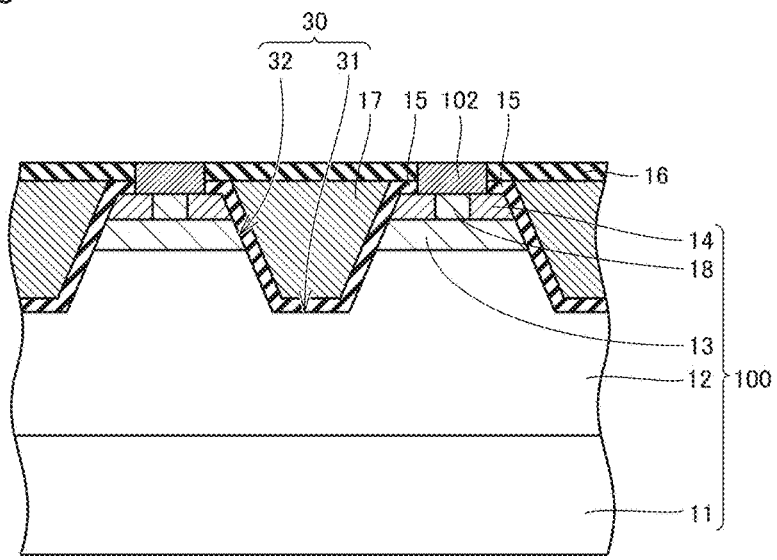
FIG. 10 is a schematic cross-sectional view illustrating an electrode layer forming step.

In an electrode forming step (S103), electrode layer 102 in ohmic contact with both of n-type region 14 and p-type region 18 shown in FIG. 10 is formed by heating material layer 101. Heating is conducted, for example, in an atmosphere of an inert gas such as argon (Ar). A heating temperature may be not lower than 800° C. and not higher than 1200° C. When the heating temperature is lower than 800° C., sufficient ohmic contact is not established and a contact resistance can be high. When the heating temperature exceeds 1200° C., evaporation of Al is vigorous and variation in thickness of electrode layer 102 can be great. The heating temperature may be not lower than 900° C. and not higher than 1100° C. A time period for heating is, for example, approximately from 1 to 10 minutes.

[Coating Layer Forming Step (S104)]

Figure 11:
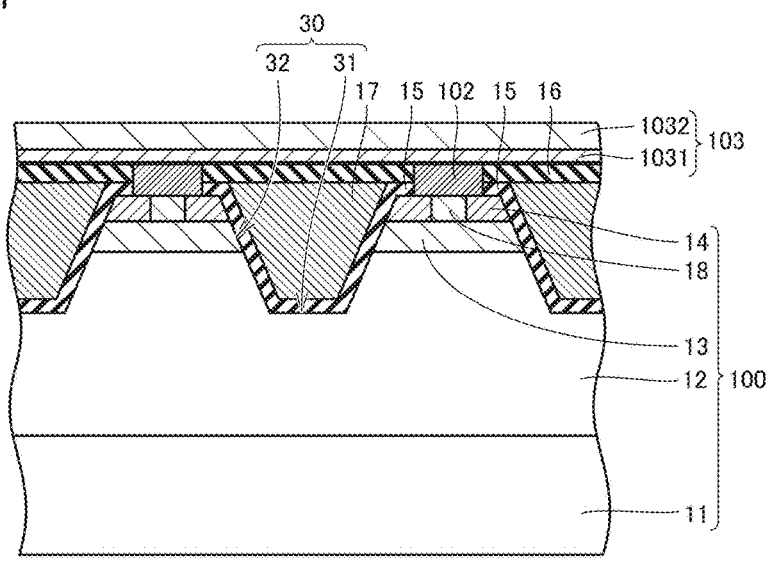
FIG. 11 is a schematic cross-sectional view illustrating a coating layer forming step.

As shown in FIG. 11, in the coating layer forming step (S104), coating layer 103 is formed on electrode layer 102. Coating layer 103 is formed, for example, with sputtering. Coating layer 103 is typically a barrier metal layer 1031, and it is composed, for example, of Ti, titanium nitride (TiN), tungsten (W), or tantalum (Ta). When coating layer 103 is formed from barrier metal layer 1031, a metal interconnection layer 1032 is further formed thereon. Metal interconnection layer 1032 is composed, for example, of Al. Alternatively, metal interconnection layer 1032 may directly be formed on electrode layer 102 without forming barrier metal layer 1031. Coating layer 103 can be formed from a barrier metal layer or a metal interconnection layer.

Figure 12:
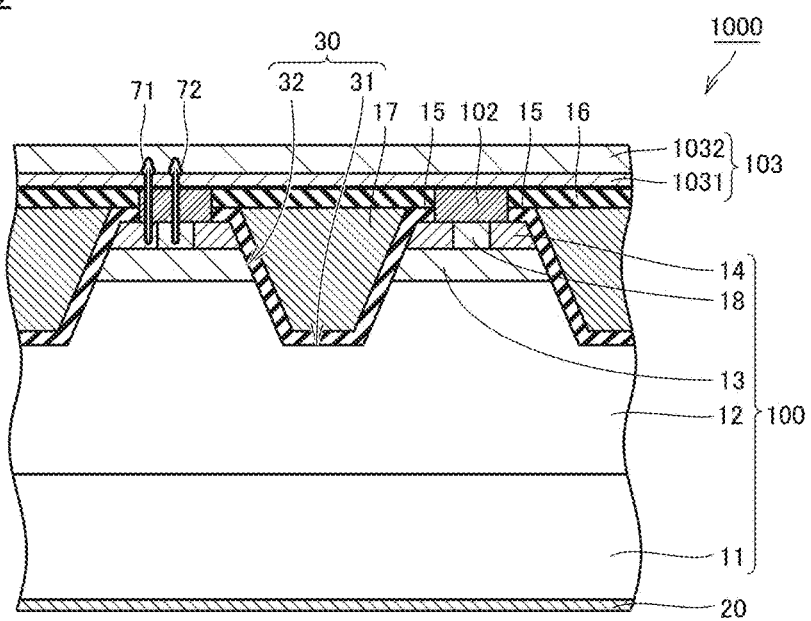
FIG. 12 is a schematic cross-sectional view showing one example of a construction of a silicon carbide semiconductor device according to one manner of the present disclosure.

Thereafter, as shown in FIG. 12, a drain electrode 20 is formed, for example, with sputtering, on a main surface of single-crystal substrate 11 opposite to a main surface where SiC layer 100 is formed. Drain electrode 20 is composed, for example, of an alloy of Ni and Si. An SiC semiconductor device 1000 is thus manufactured.

[Evaluation]

[Manufacturing of Silicon Carbide Semiconductor Device]

Silicon carbide semiconductor devices according to samples 1 to 4 were manufactured as below.

Initially, SiC single-crystal substrate 11 including SiC layer 100 (epitaxial layer) was prepared. Then, various element structures including n-type region 14 and p-type region 18 were formed in SiC layer 100 (S101).

Material layer 101 was formed by stacking the Ti layer, the Al layer, and the Si layer in this order on n-type region 14 and p-type region 18 to thicknesses shown in Table 1 (S102). Sputtering was employed for forming each layer.

Then, electrode layer 102 was formed by heating material layer 101 for 5 minutes at 1000° C. (S103). Thereafter, further with sputtering, barrier metal layer 1031 composed of TiN and metal interconnection layer 1032 composed of Al were stacked on electrode layer 102 as coating layer 103.

TABLE 1

| | Material Layer | | | | | |
|---|---|---|---|---|---|---|
| | Ti Layer [nm] | Al Layer [nm] | Si Layer [nm] | Total Thickness [nm] | Composition (Ti, Al, Si) | Composition Ratio (x, y, z) |
| Sample 1 | 60 | 90 | 30 | 180 | (3, 3, 1) | (3, 3, 1) |
| Sample 2 | 60 | 90 | 90 | 240 | (3, 3, 3) | (1, 1, 1) |
| Sample 3 | 20 | 60 | 90 | 170 | (1, 2, 3) | (1, 2, 3) |
| Sample 4 | 100 | 150 | 150 | 400 | (5, 5, 5) | (1, 1, 1) |

Contact resistances of samples 1 to 4 (on the n-type region and the p-type region) were measured with TLM.

Figure 13:
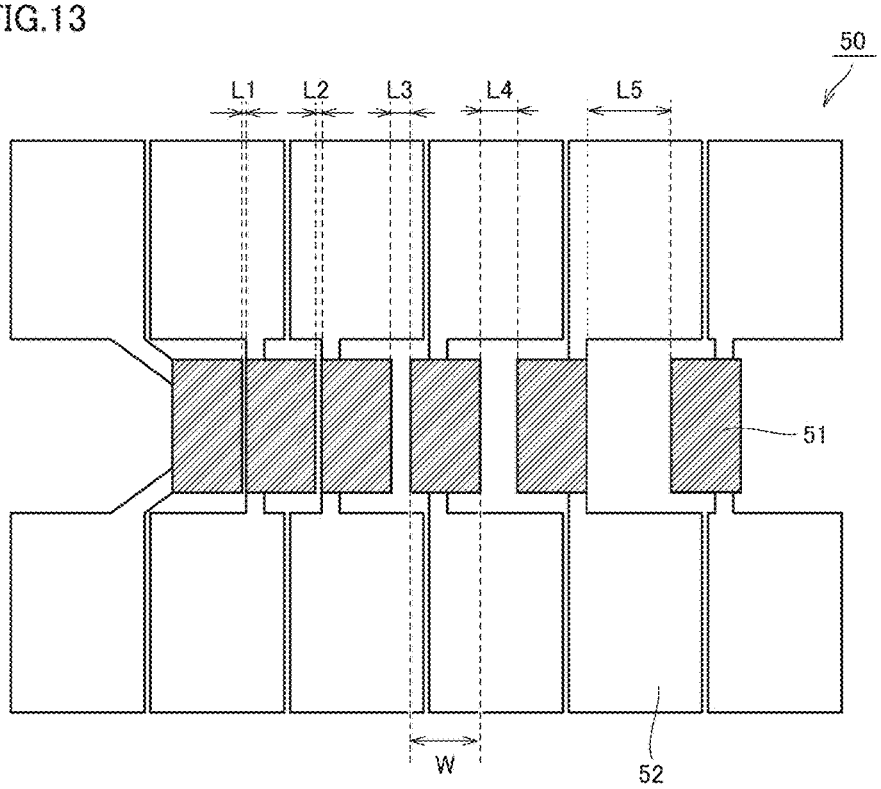
FIG. 13 is a schematic plan view showing one example of a TEG pattern.

FIG. 13 is a schematic plan view showing a first TEG pattern 50 (a large pattern) which has conventionally been used. First TEG pattern 50 includes an electrode portion 51 and a pad portion 52. Electrode portion 51 is rectangular in a plan view. Electrode portion 51 has a long side of 100 μm long and a short side of 50 μm long (a pattern width (W)). An interval between adjacent electrode portions 51 (interval between electrodes (L1) to (L5)) is designed to gradually increase as shown in Table 2. One straight line is obtained by bringing a measurement probe (probe) in contact with any adjacent pad portions 52, measuring an I-V characteristic, and plotting results of measurement on a graph in which the abscissa represents a distance between electrodes and the ordinate represents an electrode resistance. A contact resistance is found by conducting TLM analysis using segments of this straight line and each axis.

Figure 14:
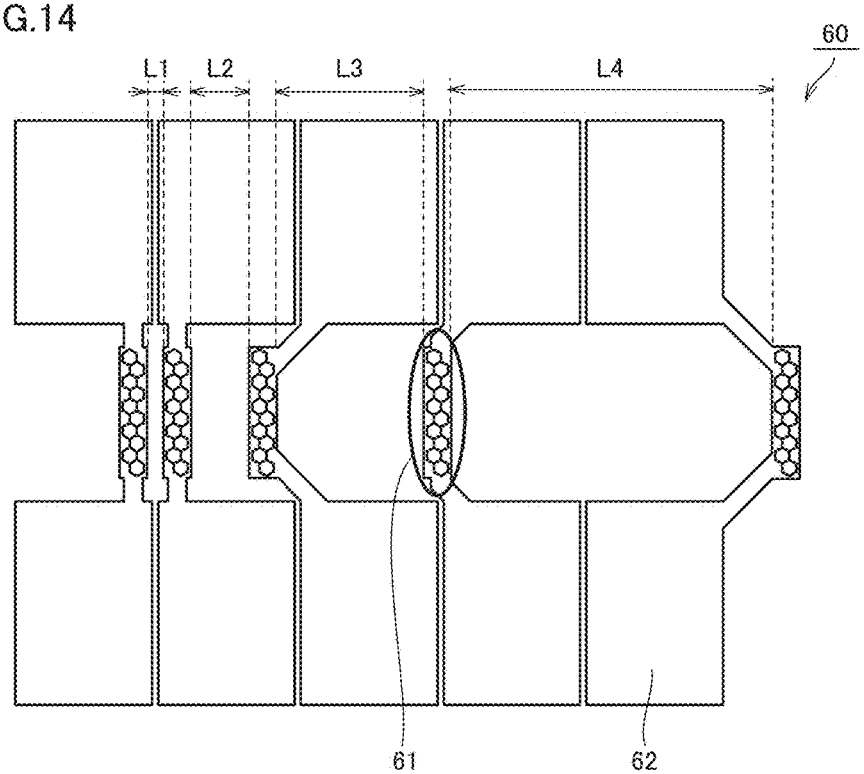
FIG. 14 is a schematic plan view showing another example of a TEG pattern.
Figure 15:
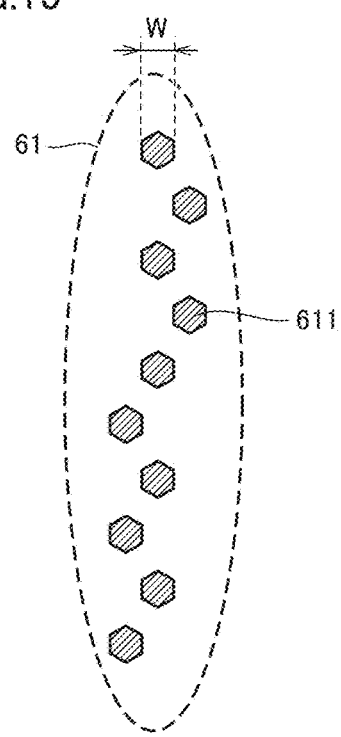
FIG. 15 is a schematic plan view showing a main portion in FIG. 14.

FIGS. 14 and 15 are schematic plan views showing a newly developed second TEG pattern 60 (a small pattern). Second TEG pattern 60 also includes an electrode portion 61 and a pad portion 62. As shown in FIG. 15, electrode portion 61 includes a plurality of electrodes 611 and electrode 611 is in a shape corresponding to the top surface of the mesa described previously (electrode layer 102), that is, in a hexagonal shape. Table 2 shows a pattern width (W) and an interval between electrodes (L1) to (L4) in second TEG pattern 60.

TABLE 2

| | | Pattern Width | Interval Between Electrodes [μm] | | | | |
|---|---|---|---|---|---|---|---|
| | | W [μm] | L1 | L2 | L3 | L4 | L5 |
| First TEG Pattern | Large Pattern (L-TEG) | 50 | 4 | 8 | 16 | 32 | 64 |
| Second TEG Pattern | Small Pattern (S-TEG) | 3.2 | 32 | 64 | 128 | 256 | — |

Figure 16:
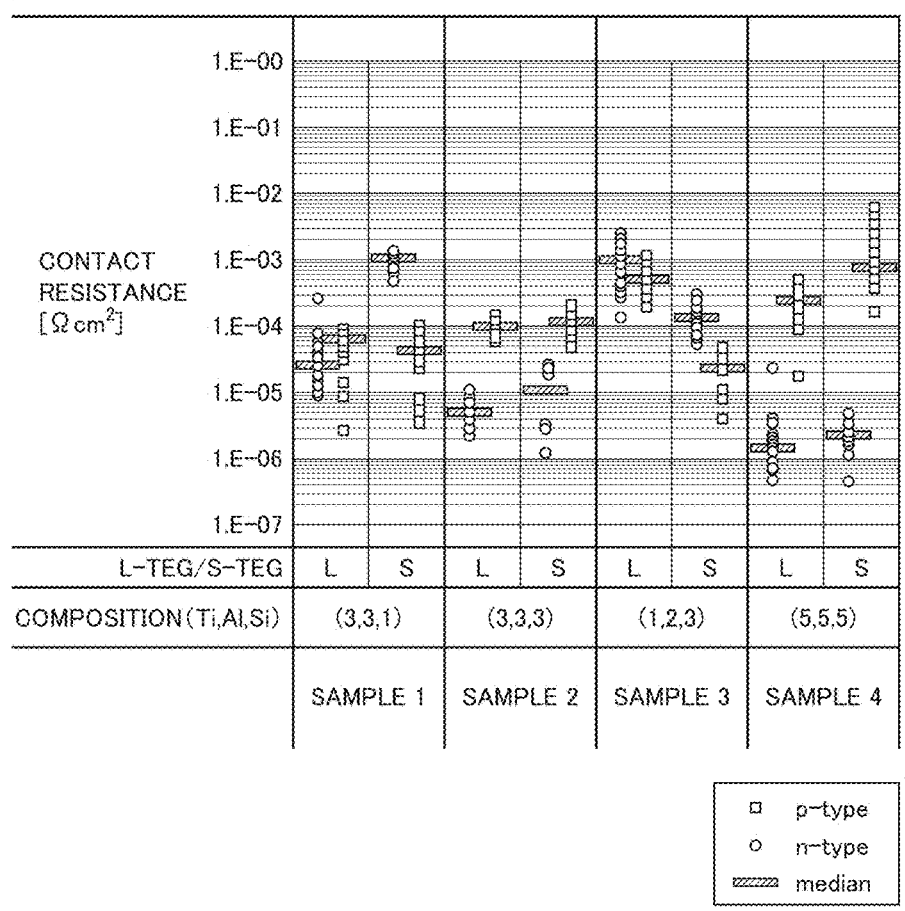
FIG. 16 is a diagram showing one example of a result of measurement of a contact resistance.

FIG. 16 shows results of measurement of contact resistances in samples 1 to 4. In FIG. 16, "L" in the field of "L-TEG/S-TEG" shows a result of measurement for the large pattern (first TEG pattern 50) and "S" shows a result of measurement for the small pattern (second TEG pattern 60). A circular mark shows a contact resistance against the n-type region (hereinafter denoted as "Rn") and a square mark shows a contact resistance against the p-type region (hereinafter denoted as "Rp"). A mark in a shape of a crossbar shows a median (central value) of each measurement value.

1. As to Sample 1

The composition (Ti, Al, Si) of the material layer of sample 1 is (3, 3, 1) and the composition ratio (x, y, z) is not included in first triangular pyramidal region 91 shown in FIG. 8. The composition ratio of sample 1 is higher in ratio of the number of atoms of Ti and Al and lower in ratio of the number of atoms of Si than the composition ratio in first triangular pyramidal region 91. As shown in FIG. 16, in measurement for the large pattern (L-TEG) of sample 1, Rn and Rp are both low and are apparently satisfactory. In measurement for the small pattern (S-TEG), however, Rn becomes worse by one or two orders of magnitude.

2. As to Sample 2

The composition (Ti, Al, Si) of the material layer of sample 2 is (3, 3, 3) and the composition ratio (x, y, z) is included in first triangular pyramidal region 91. In FIG. 16, Rn of sample 2 slightly increases in measurement for the small pattern, however, a difference between the result of measurement for the large pattern and the result of measurement for the small pattern is small as a whole and the difference is suppressed within one order of magnitude. Sample 2 can be concluded to be low in area dependency of the TEG pattern. Rn and Rp of sample 2 are both low and satisfactory. The composition ratio of the material layer of sample 2 is included also in second triangular pyramidal region 92 shown in FIG. 8.

3. As to Sample 3

The composition (Ti, Al, Si) of the material layer of sample 3 is (1, 2, 3) and the composition ratio (x, y, z) is not included in first triangular pyramidal region 91. The composition ratio of sample 3 is higher in ratio of the number of atoms of Si and Al and lower in ratio of the number of atoms of Ti than the composition ratio in first triangular pyramidal region 91. In FIG. 16, a difference of sample 3 between the result of measurement for the large pattern and the result of measurement for the small pattern is great and area dependency of the TEG pattern is found. Tendency of high Rn was confirmed in sample 3.

4. As to Sample 4

The composition (Ti, Al, Si) of the material layer of sample 4 is (5, 5, 5) and the composition ratio (x, y, z) is included in first triangular pyramidal region 91 similarly to sample 2. In FIG. 16, a difference of sample 4 between the result of measurement for the large pattern and the result of measurement for the small pattern is small and the difference is suppressed within one order of magnitude. Sample 4 can be concluded to be low in area dependency of the TEG pattern. The result shows particularly low Rn. This may be because uniformity in thickness of the electrode layer has improved due to a large thickness of the material layer (the total thickness of the Ti layer, the Al layer, and the Si layer). The composition ratio of the material layer of sample 4 is included also in second triangular pyramidal region 92.

It could be demonstrated based on the results above that electrode layer 102 exhibiting a low contact resistance against both of n-type region 14 and p-type region 18 and being low in area dependency of the TEG pattern could be formed by determining composition of material layer 101 such that the point (x, y, z) is included in first triangular pyramidal region 91 having four points of the origin (0, 0, 0), the point (1, 2, 2), the point (2, 1, 2), and the point (2, 2, 1) as vertices, where the point (x, y, z) in the three-dimensional rectangular coordinates in which the X axis represents a ratio of the number of atoms of Ti, the Y axis represents a ratio of the number of atoms of Al, and the Z axis represents a ratio of the number of atoms of Si (x, y, and z each being a numeric value greater than 0) represents a composition ratio among Ti, Al, and Si contained in material layer 101.

[Analysis of Composition of Electrode Layer]

Composition of the electrode layer obtained from the material layer having a composition ratio included in first triangular pyramidal region 91 was then analyzed.

SiC semiconductor devices according to samples 5 and 6 were obtained as samples for composition analysis similarly to samples 1 to 4 except for change in thicknesses of the Ti layer, the Al layer, and the Si layer as shown in Table 3. The electrode layers according to samples 5 and 6 are equal to each other in ratio of the number of atoms (composition ratio) among Ti, Al, and Si. As shown in Table 3, the electrode layer of sample 6 has a thickness three times as large as the electrode layer of sample 5. In the description below, a thickness of the electrode layer is denoted with a multiple, with a thickness of the electrode layer obtained from a material layer constituted of the Ti layer having a thickness of 20 nm, the Al layer having a thickness of 30 nm, and the Si layer having a thickness of 30 nm being defined as the reference. Based on this reference, for example, the electrode layer of sample 5 has a thickness "1T (×1 thickness)" and the electrode layer of sample 6 has a thickness "3T (×3 thickness)".

TABLE 3

| | Material Layer | | | | | |
|---|---|---|---|---|---|---|
| | Ti Layer [nm] | Al Layer [nm] | Si Layer [nm] | Total Thickness [nm] | Composition (Ti, Al, Si) | Composition Ratio (x, y, z) |
| Sample 5 | 20 | 30 | 30 | 80 (×1 Thickness) | (1, 1, 1) | (1, 1, 1) |
| Sample 6 | 60 | 90 | 90 | 240 (×3 Thickness) | (3, 3, 3) | (1, 1, 1) |

With Micro-Sampling®, a cross-sectional sample perpendicular to the surface of electrode layer 102 was obtained and the cross-sectional sample was analyzed with STEM-EDX. The cross-sectional sample was thinned to a thickness approximately from 100 to 150 nm with a focused ion beam (FIB) system so as to allow sufficient passage of electron beams therethrough, and an acceleration voltage in STEM was set approximately to 200 kV. Spatial resolution of approximately several nm was thus ensured.

Figure 17:
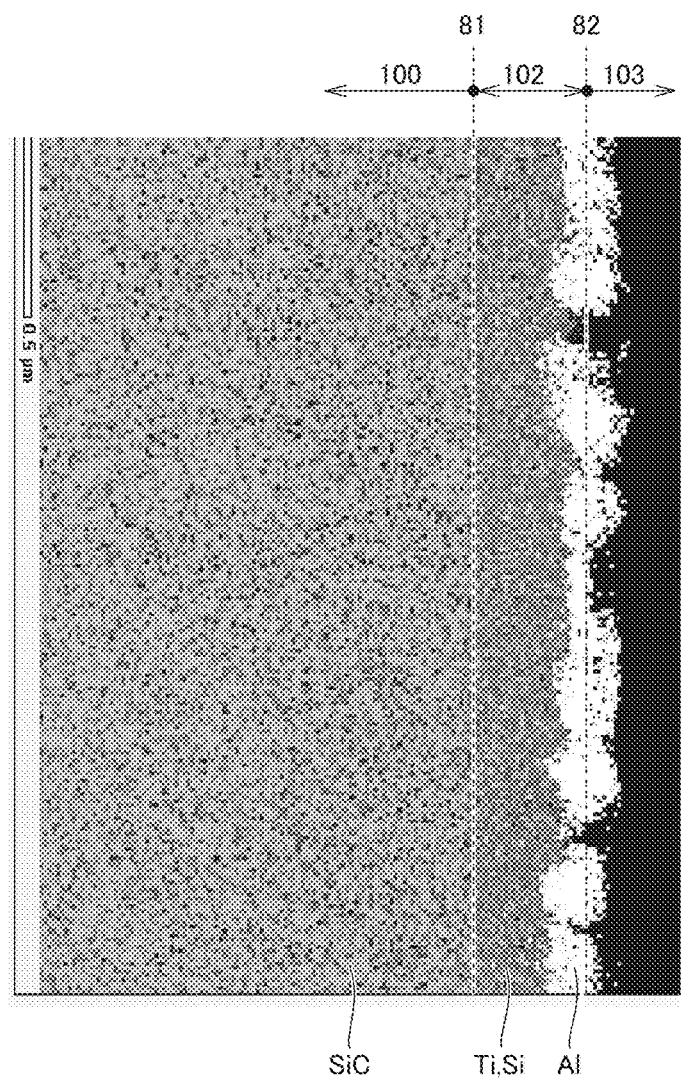
FIG. 17 is a diagram showing one example of element mapping in a cross-section in a direction of thickness of an electrode layer.

FIG. 17 shows a result of surface analysis of the cross-sectional sample, that is, a result of element mapping in a region from the inside of SiC layer 100 through electrode layer 102 to the inside of coating layer 103 (barrier metal layer 1031 and metal interconnection layer 1032). As can be seen in FIG. 17, in electrode layer 102 obtained from material layer 101 having the composition above, Al is segregated at interface 82 between electrode layer 102 and coating layer 103.

Then, transition of an atom concentration of a detected element on a line from n-type region 14 or p-type region 18 through electrode layer 102 to coating layer 103 along the direction of thickness of electrode layer 102 as shown with an arrow 71 and an arrow 82 in FIG. 12 was investigated.

1-1. As to Composition of Electrode Layer on n-Type Region (Thickness of 3T)

Figure 18:
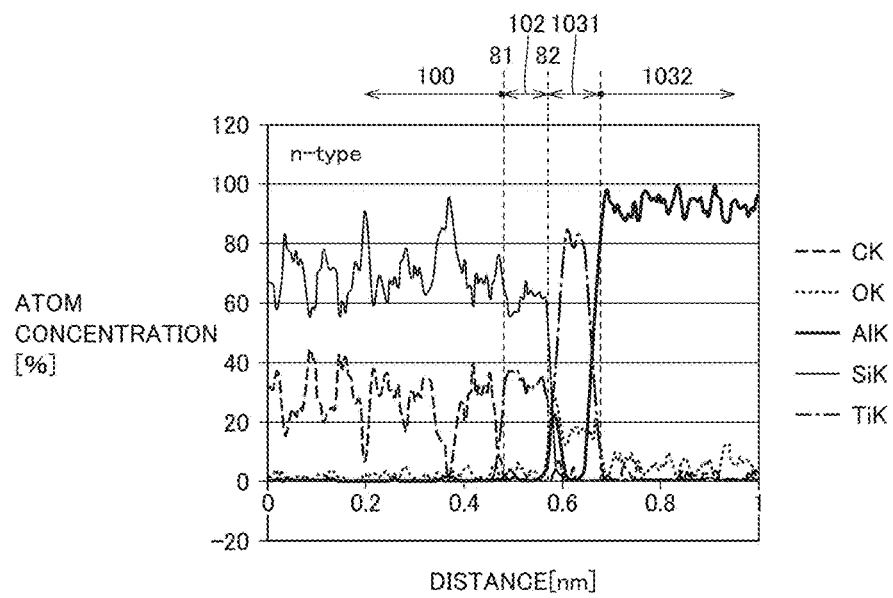
FIG. 18 is a graph showing one example of transition of an atom concentration of an element in the direction of thickness of the electrode layer on an n-type region.

FIG. 18 is a graph showing transition of an atom concentration of each element on arrow 71 in sample 6 (having a thickness of 3T). The abscissa in FIG. 18 represents a distance [unit: nm] along the direction of thickness of electrode layer 102 and the ordinate represents an atom concentration [unit: %] of each element. As shown in FIG. 18, the inside of electrode layer 102 is mainly composed of Ti and Si and Al is segregated at interface 82 between electrode layer 102 and coating layer 103 (barrier metal layer 1031) as described previously.

Figure 19:
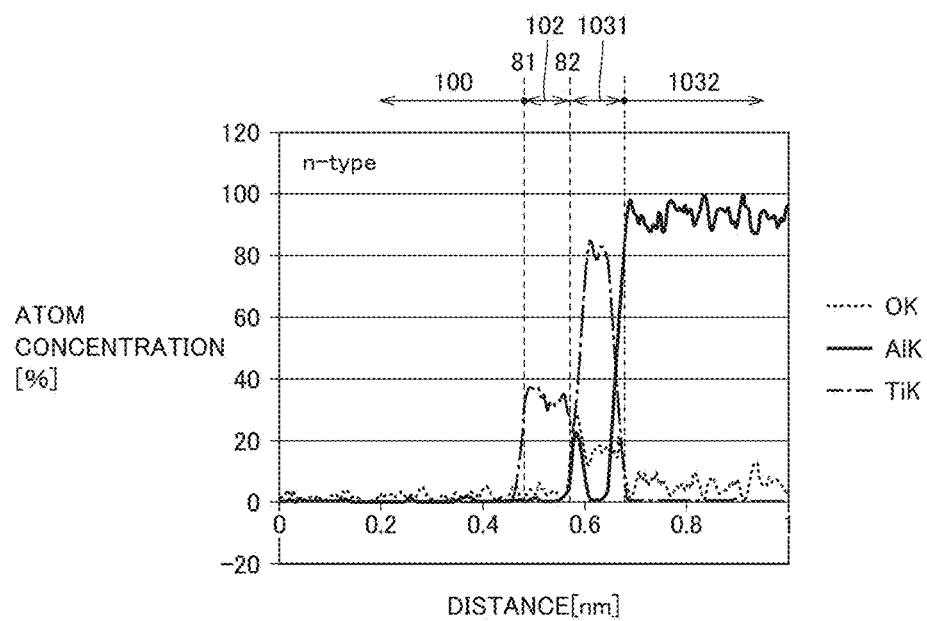
FIG. 19 is a graph showing only O, Al, and Ti extracted from FIG. 18.

FIG. 19 is a graph showing only O (oxygen), Al, and Ti extracted from FIG. 18. It can be seen in FIG. 18 that electrode layer 102 contains O in addition to Ti, Al, and Si, and Al and O are present at interface 82 between electrode layer 102 and coating layer 103.

An atom concentration of Al in the inside of electrode layer 102 is lower than an atom concentration of Al at interface 82. Furthermore, an atom concentration of O in the inside of electrode layer 102 is also lower than an atom concentration of O at interface 82.

With attention being paid to transition of carbon (C) in FIG. 18, it can be seen that an atom concentration of C in electrode layer 102 is very low. Table 4 shows an atom concentration of C at interface 81 between electrode layer 102 and SiC layer 100 and an average value of an atom concentration of C in the inside of electrode layer 102. As shown in Table 4, the atom concentration of C at interface 81 between electrode layer 102 and SiC layer 100 is not higher than 10%. The inside of electrode layer 102 is lower in atom concentration of C than interface 81.

TABLE 4

| | Thickness | Position | Interface Between SiC Layer and Electrode Layer Atom Concentration [%] | Inside of Electrode Layer Average Value of Atom Concentration [%] |
|---|---|---|---|---|
| Sample 5 | 1T (×1 Thickness) | on n-Type Region | 8.2 | 2.1 |
| | | on p-Type Region | 4.8 | 2.8 |
| Sample 6 | 3T (×3 Thickness) | on n-Type Region | 6.6 | 0.9 |
| | | on p-Type Region | 3.9 | 1.1 |

1-2. As to Composition of Electrode Layer on p-Type Region (Electrode Layer Having Thickness of 3T)

Figure 20:
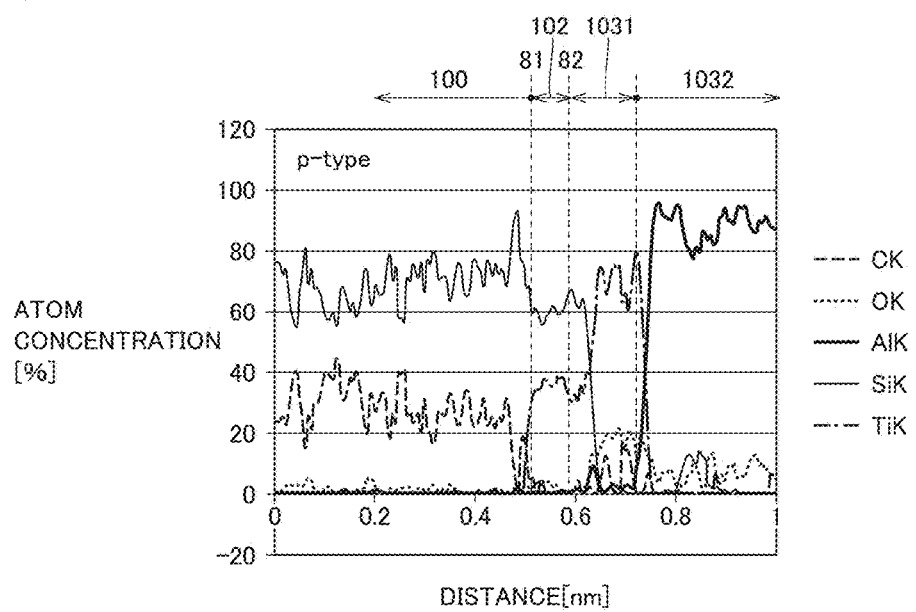
FIG. 20 is a graph showing one example of transition of an atom concentration of an element in the direction of thickness of the electrode layer on a p-type region.
Figure 21:
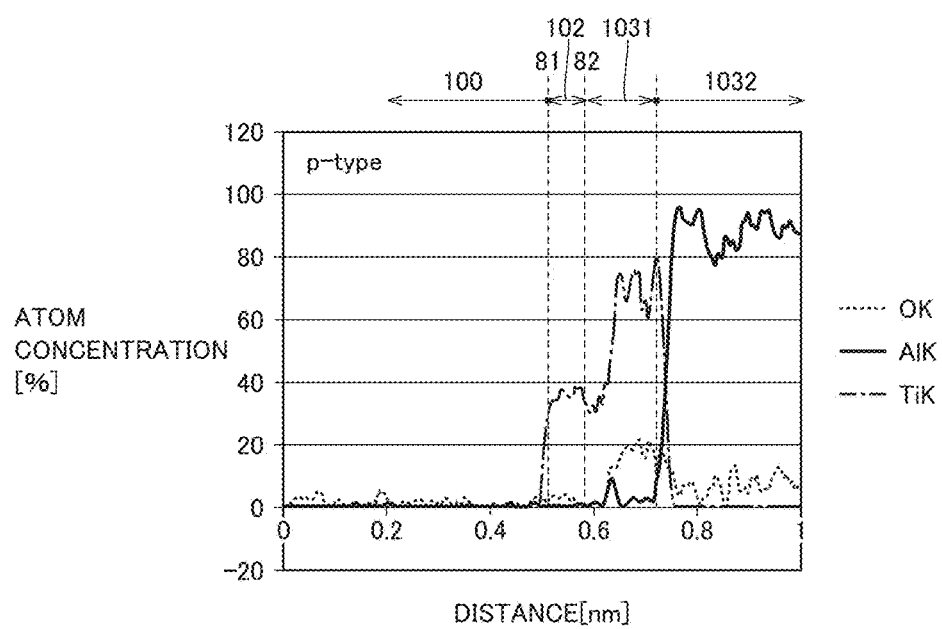
FIG. 21 is a graph showing only O, Al, and Ti extracted from FIG. 20.

FIG. 20 is a graph showing transition of an atom concentration of each element on arrow 72 in sample 6 (having a thickness of 3T) and FIG. 21 is a graph showing only O, Al, and Ti extracted from FIG. 20. Transition of each element on p-type region 18 is also similar to transition of each element on n-type region 14 described previously and there is not much difference. On p-type region 18 as well, electrode layer 102 contains 0 in addition to Ti, Al, and Si, and Al and O are present at interface 82 between electrode layer 102 and coating layer 103.

As in the case of n-type region 14, an atom concentration of Al in the inside of electrode layer 102 is lower than an atom concentration of Al at interface 82 and an atom concentration of O in the inside of electrode layer 102 is also lower than an atom concentration of O at interface 82.

As in the case of n-type region 14, an atom concentration of C in electrode layer 102 is also low. Table 4 shows the atom concentration of C at interface 81 between electrode layer 102 and SiC layer 100 and the average value of the atom concentration of C in the inside of electrode layer 102.

2-1. As to Composition of Electrode Layer on n-Type Region (Electrode Layer Having Thickness of 1T)

Figure 22:
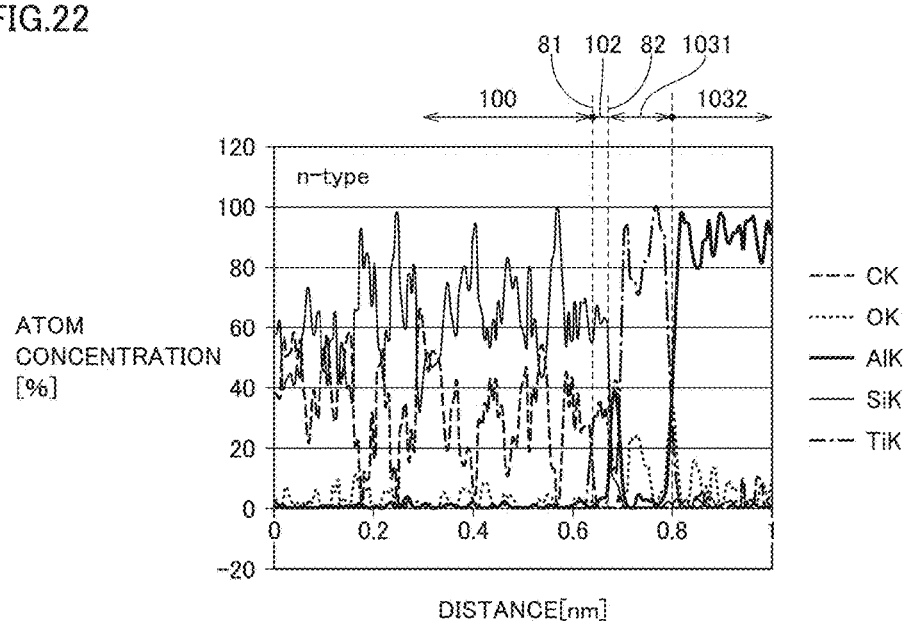
FIG. 22 is a graph showing another example of transition of an atom concentration of an element in the direction of thickness of the electrode layer on the n-type region.
Figure 23:
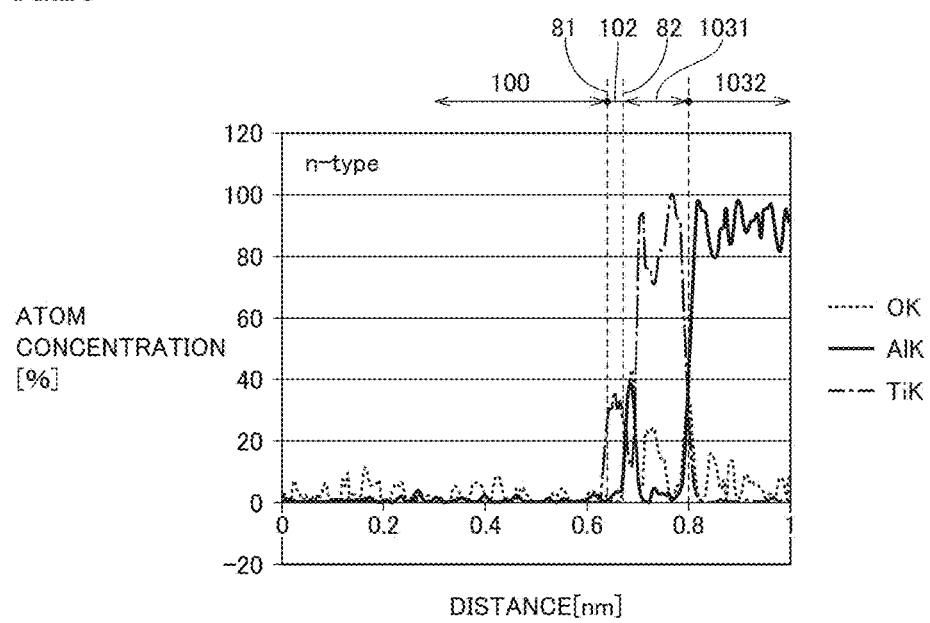
FIG. 23 is a graph showing only O, Al, and Ti extracted from FIG. 22.

FIG. 22 is a graph showing transition of an atom concentration of each element on arrow 71 in sample 5 (having a thickness of 1T). FIG. 23 is a graph showing only O, Al, and Ti extracted from FIG. 22. Presence of Al and O at interface 82 between electrode layer 102 and coating layer 103 is the same as in sample 6 (having a thickness of 3T). As compared with the transition in sample 6 (3T) described previously, however, Al has been introduced into the inside of electrode layer 102 owing to decrease in thickness. In this case, a distance between n-type region 14 and a location where Al less likely to establish ohmic contact with n-type region 14 is present is short and increase in contact resistance against n-type region 14 is concerned. C has also been introduced into the inside of electrode layer 102, and interference of ohmic contact thereby is also concerned.

2-2. As to Composition of Electrode Layer on p-Type Region (Electrode Layer Having Thickness of 1T)

Figure 24:
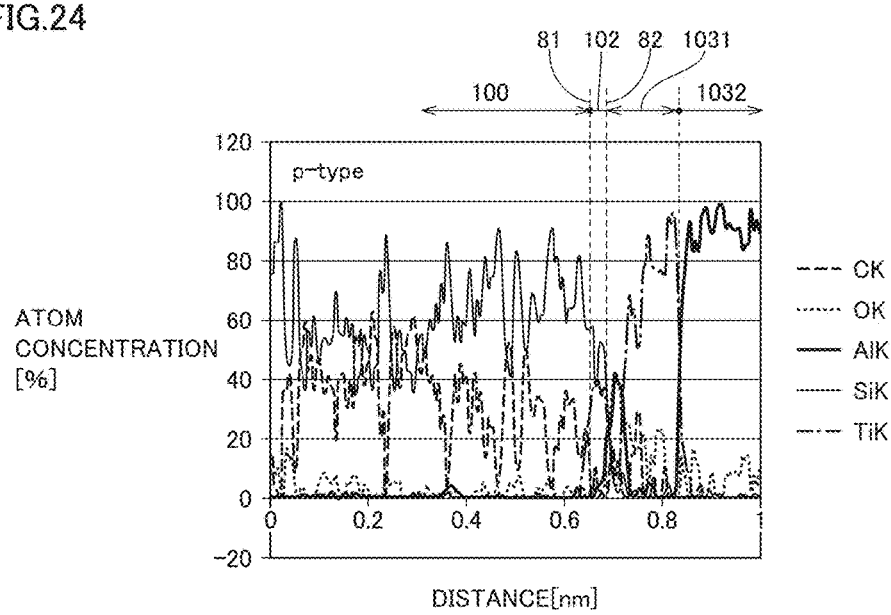
FIG. 24 is a graph showing another example of transition of an atom concentration of an element in the direction of thickness of the electrode layer on the p-type region.
Figure 25:
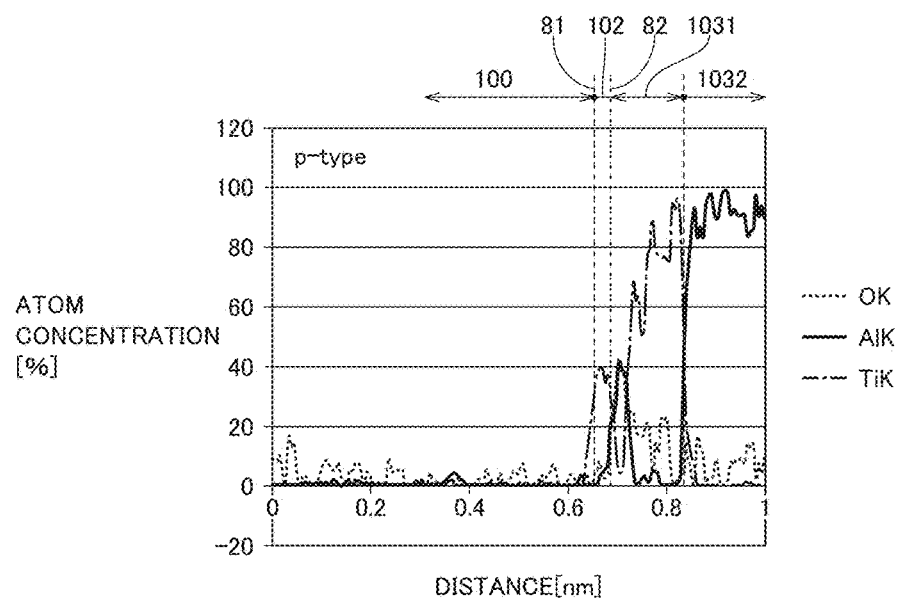
FIG. 25 is a graph showing only O, Al, and Ti extracted from FIG. 24.

FIG. 24 is a graph showing transition of an atom concentration of each element on arrow 72 in sample 5 (having a thickness of 1T). FIG. 25 is a graph showing only O, Al, and Ti extracted from FIG. 24. It can be seen that, in the case of 1T (×1 thickness) as well, there is not much difference in composition of electrode layer 102 between n-type region 14 and p-type region 18, and Al and O are present at interface 82 between electrode layer 102 and coating layer 103 also on p-type region 18, and Al and O have been introduced into the inside of electrode layer 102 as compared with sample 6 (having a thickness of 3T).

3. As to Distribution of Al and O in Electrode Layer

Figure 26:
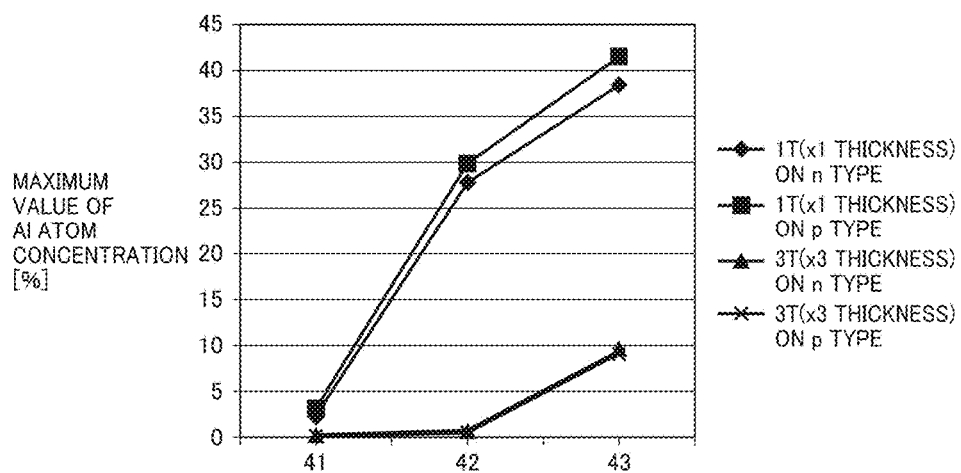
FIG. 26 is a graph showing transition of a maximum value of an atom concentration of Al in the direction of thickness of the electrode layer.
Figure 27:
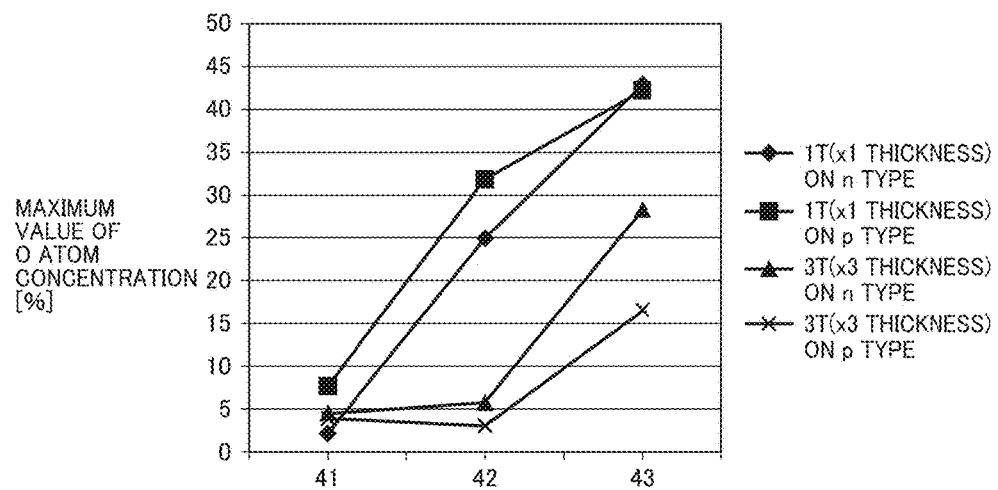
FIG. 27 is a graph showing transition of a maximum value of an atom concentration of O in the direction of thickness of the electrode layer.

As set forth above, electrode layer 102 is found to be characteristic in distribution of Al and O. FIG. 26 shows a graph in which a maximum value of an atom concentration of Al in each region is plotted, with electrode layer 102 of each of sample 5 (having a thickness of 1T) and sample 6 (having a thickness of 3T) described previously being divided into three equal regions of a first region 41 including interface 81, a second region 42 including a central portion of the electrode layer, and a third region 43 including interface 82 in the direction of thickness and each region being represented on the abscissa. FIG. 27 shows a graph of similar plotting for O.

As can be seen in FIGS. 26 and 27, distributions of Al and O are similar, and a concentration increases from the inside toward the surface layer (third region 43) of the electrode. This tendency is common between the n-type region and the p-type region. As described previously, as electrode layer 102 is greater in thickness, a concentration of Al and O lowers in a region extending from interface 81 with SiC layer 100 (first region 41) to the inside of the electrode (second region 42). For example, in the case of 1T (×1 thickness), with a maximum value of the atom concentration of Al in third region 43 (the surface layer of the electrode) being defined as "1", a maximum value of the atom concentration of Al in second region 42 (the inside of the electrode) is approximately from "0.70 to 0.75." In contrast, in the case of 3T (×3 thickness), with the maximum value of the atom concentration of Al in third region 43 being defined as "1", the maximum value of the atom concentration of Al in second region 42 decreases to "0.1" or smaller.

Figure 28:
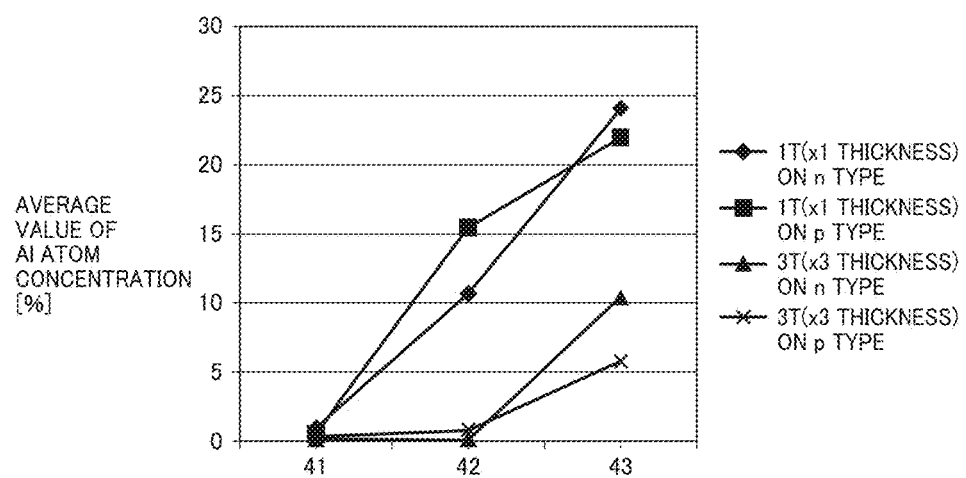
FIG. 28 is a graph showing transition of an average value of an atom concentration of Al in the direction of thickness of the electrode layer.
Figure 29:
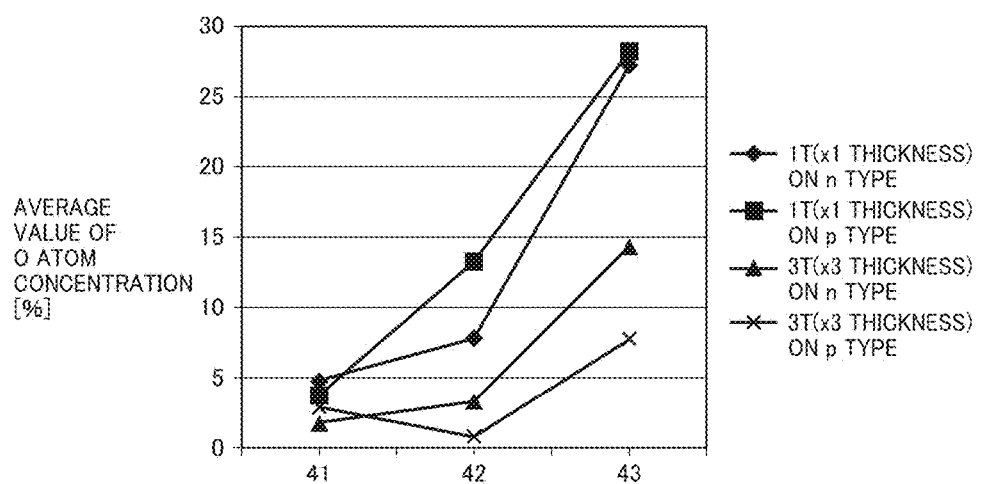
FIG. 29 is a graph showing transition of an average value of an atom concentration of O in the direction of thickness of the electrode layer.

FIGS. 28 and 29 show graphs in which an average value of the atom concentration of Al and an average value of the atom concentration of O are plotted as in FIGS. 26 and 27, respectively. Tendency the same as transition of the maximum value described previously is read also on transition of the average value.

As set forth above, in electrode layer 102 according to the present embodiment, behaviors of Al and O are found to correlate with each other.

[Relation Between Thickness of Electrode Layer and Contact Resistance]

Figure 32:
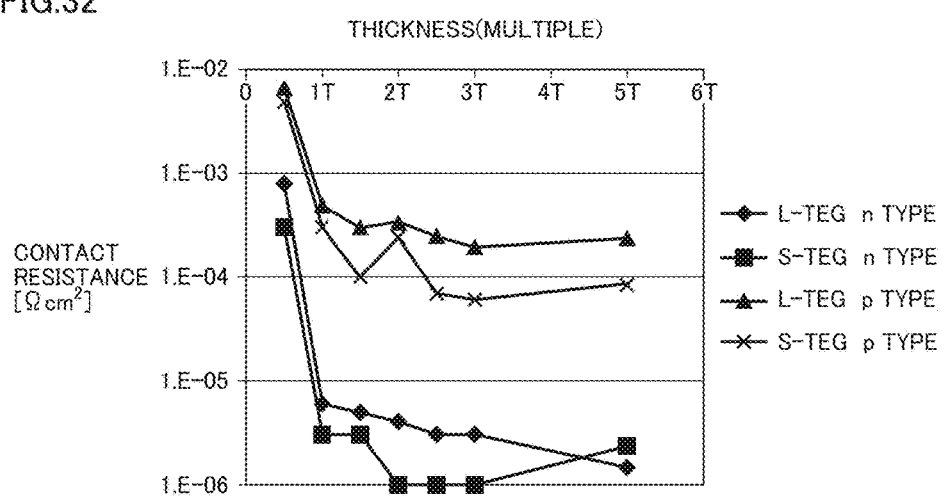
FIG. 32 is a graph showing one example of relation between a thickness of the electrode layer and a contact resistance.

As described above, it was found that a thickness of electrode layer 102 (that is, a thickness of material layer 101 which was the original material) was a factor affecting composition (distribution of Al and O) of electrode layer 102. Then, relation between a thickness of electrode layer 102 and a contact resistance was investigated. FIG. 32 is a graph showing relation between a thickness of the electrode layer and a contact resistance. The abscissa in FIG. 32 shows a multiple of 1T and the ordinate shows a contact resistance. The contact resistance was measured on n-type region 14 and p-type region 18 using the large pattern (L-TEG) and the small pattern (S-TEG) described previously. Measurement was conducted in a range from 0.5T (×0.5 thickness) to 5T (×5 thickness). A thickness of each layer (a ratio of the number of atoms among Ti, Al, and Si) in material layer 101 was set as in samples 5 and 6 described previously.

As can be seen in FIG. 32, a contact resistance suddenly lowers as the thickness of the electrode layer increased from 0.5T to 1.0T, and once the thickness attained to 1.0T, the contact resistance started to gradually decrease. The reason for such a result may be relevant to a behavior of evaporation of the original material (Si and Al) as described previously.

[Relation Between Uniformity in Thickness of Electrode Layer and Contact Resistance]

Figure 33:
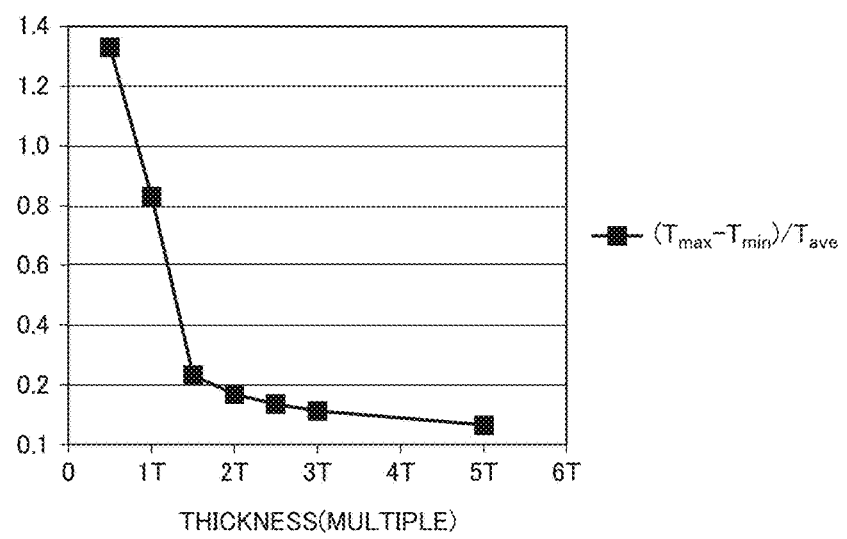
FIG. 33 is a graph showing one example of relation between a thickness of the electrode layer and uniformity in thickness of the electrode layer.

Then, relation between uniformity in thickness of electrode layer 102 and a contact resistance was investigated. Initially, a plurality of samples (electrode layers) different in thickness were prepared and contact resistances were measured. Then, in accordance with the method described previously, a cross-sectional sample of each electrode layer was obtained, an average value ($T_{ave}$), a maximum value ($T_{max}$), and a minimum value ($T_{min}$) of a thickness of the electrode layer were measured, and "$(T_{max}-T_{min})/T_{ave}$" which was an indicator of uniformity in thickness was calculated. FIG. 33 shows results. In FIG. 33, the abscissa represents a thickness of the electrode layer (a multiple of 1T) and the ordinate represents a value for "$(T_{max}-T_{min})/T_{ave}$".

As can be seen in FIG. 33, with variation in thickness from 0.5T to 1.5T, a value for "$(T_{max}-T_{min})/T_{ave}$" suddenly decreases to 1.0 or smaller, it attains to approximately 0.2 when the thickness is 1.5T, and once the thickness attains to 1.5T, the value starts to gradually decrease. Therefore, electrode layer 102 has a thickness preferably not smaller than 1.5T. By way of example, Table 5 shows an average value ($T_{ave}$) of a thickness of the electrode layer, "$(T_{max}-T_{min})/T_{ave}$", and a result of measurement of a contact resistance when the thickness is 1T and 3T.

TABLE 5

| Thickness | $T_{ave}$ [nm] | $(T_{max} - T_{min})/T_{ave}$ [—] | Contact Resistance [$\Omega cm^2$] |
|---|---|---|---|
| 1T (×1 Thickness) | 62 | 0.83 | $2 \times 10^{-5}$ |
| 3T (×3 Thickness) | 235 | 0.11 | $5 \times 10^{-6}$ |

Figure 30:
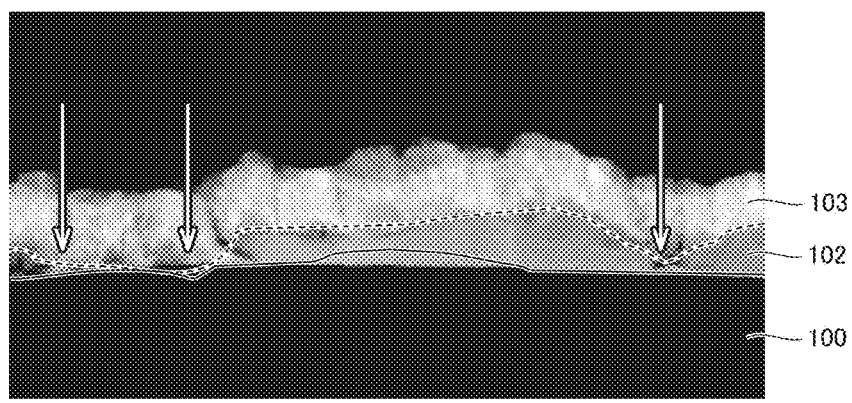
FIG. 30 shows a STEM image showing one example of a cross-section in the direction of thickness of the electrode layer.
Figure 31:
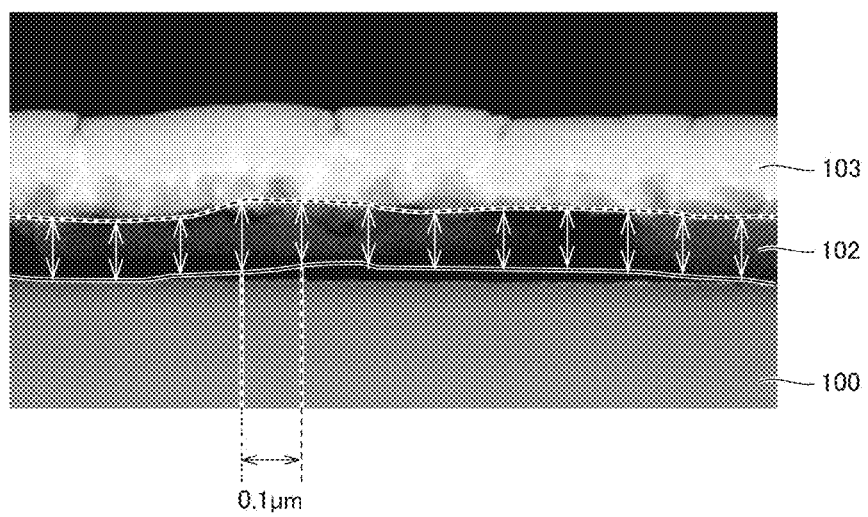
FIG. 31 shows a STEM image showing another example of a cross-section in the direction of thickness of the electrode layer.

It can be seen in Table 5 that a contact resistance can be lower with higher uniformity in thickness of the electrode layer. FIGS. 30 and 31 show actual STEM images of the samples shown in Table 5. It is expected from FIG. 30 that, in a sample having uniformity in thickness ("$(T_{max}-T_{min})/T_{ave}$") of 0.83, a portion where a thickness is locally close to zero (0) is present and thus a contact resistance has increased. In contrast, in a sample having uniformity in thickness of 0.11 shown in FIG. 31, a thickness of the electrode layer is very uniform and a contact resistance is low. Based on these results, "$(T_{max}-T_{min})/T_{ave}$" is preferably not greater than 1.0, more preferably not greater than 0.80, and particularly preferably not greater than 0.20. An average value ($T_{ave}$) of a thickness of the electrode layer is preferably not smaller than 50 nm and particularly preferably not smaller than 100 nm and not greater than 300 nm.

It should be understood that the embodiment disclosed herein is illustrative and non-restrictive in every respect. The scope of the present invention is defined by the terms of the claims, rather than the embodiment above, and is intended to include any modifications within the scope and meaning equivalent to the terms of the claims.

REFERENCE SIGNS LIST 11 single-crystal substrate; 12 drift layer; 13 body region; 14 n-type region; 15 gate insulating film; 16 interlayer insulating film; 17 gate electrode; 18 p-type region; 20 drain electrode; 30 trench; 31 bottom portion; 32 sidewall; 41 first region; 42 second region; 43 third region; 50, 60 pattern; 51, 61 electrode portion; 611 electrode; 52, 62 pad portion; 71, 72 arrow; 81, 82 interface; 91 first triangular pyramidal region; 92 second triangular pyramidal region; 100 silicon carbide (SiC) layer; 101 material layer; 1011 Ti layer; 1012 Al layer; 1013 Si layer; 102 electrode layer; 103 coating layer; 1000 silicon carbide semiconductor device; 1021 measurement region; 1031 barrier metal layer; and 1032 metal interconnection layer.

The invention claimed is:

1. A method for manufacturing a silicon carbide semiconductor device comprising:
   preparing a silicon carbide layer including an n-type region having an n conductivity type and a p-type region having a p conductivity type;
   forming a material layer containing titanium, aluminum, and silicon on the n-type region and the p-type region; and
   forming an electrode layer in contact with the n-type region and the p-type region by heating the material layer,
   the material layer having a thickness not smaller than 10 nm, and
   the material layer having a composition of (Ti, Al, Si)=(x, y, z) (x, y, and z each being a numeric value greater than 0) in three-dimensional rectangular coordinates in which an X axis represents a ratio of the number of atoms of titanium, a Y axis represents a ratio of the number of atoms of aluminum, and a Z axis represents a ratio of the number of atoms of silicon, a point (x, y, z) being included in a first triangular pyramidal region, the first triangular pyramidal region having four points of an origin (0, 0, 0), a point (1, 2, 2), a point (2, 1, 2), and a point (2, 2, 1) as vertices.

2. The method for manufacturing a silicon carbide semiconductor device according to claim 1, wherein
   the forming a material layer includes stacking a titanium layer, an aluminum layer, and a silicon layer.

3. The method for manufacturing a silicon carbide semiconductor device according to claim 1, wherein
   the material layer has a thickness not smaller than 50 nm and not greater than 500 nm.

4. The method for manufacturing a silicon carbide semiconductor device according to claim 1, wherein
in the forming an electrode layer, the material layer is heated to a temperature not lower than 800° C. and not higher than 1200° C.

5. The method for manufacturing a silicon carbide semiconductor device according to claim 1, wherein
the point (x, y, z) is included in a second triangular pyramidal region having four points of the origin (0, 0, 0), a point (1, 1.5, 1.5), a point (1.5, 1, 1.5), and a point (1.5, 1.5, 1) as vertices.

6. A silicon carbide semiconductor device comprising:
a silicon carbide layer including an n-type region having an n conductivity type and a p-type region having a p conductivity type;
an electrode layer formed on the n-type region and the p-type region as being in contact with the n-type region and the p-type region; and
a coating layer formed on the electrode layer,
the electrode layer containing titanium, aluminum, silicon, and oxygen, and
aluminum and oxygen being present at an interface between the electrode layer and the coating layer, wherein
an atom concentration of carbon at an interface between the silicon carbide layer and the electrode layer is not higher than 10%.

7. The silicon carbide semiconductor device according to claim 6, wherein
an atom concentration of aluminum in inside of the electrode layer is lower than an atom concentration of aluminum at the interface between the electrode layer and the coating layer.

8. The silicon carbide semiconductor device according to claim 6, wherein
an atom concentration of oxygen in inside of the electrode layer is lower than an atom concentration of oxygen at the interface between the electrode layer and the coating layer.

9. The silicon carbide semiconductor device according to claim 6, wherein
the coating layer is a barrier metal layer or a metal interconnection layer.

10. The silicon carbide semiconductor device according to claim 6, wherein
an average value of a thickness of the electrode layer is not smaller than 50 nm and not greater than 500 nm.

11. The silicon carbide semiconductor device according to claim 10, wherein
relation of $(T_{max}-T_{min})/T_{ave} \leq 1.0$ is satisfied, where $T_{max}$ represents a maximum value of the thickness of the electrode layer, $T_{min}$ represents a minimum value of the thickness of the electrode layer, and $T_{ave}$ represents the average value.

12. The silicon carbide semiconductor device according to claim 6, wherein
an average value of an atom concentration of carbon in inside of the electrode layer is not higher than 10%.

13. A silicon carbide semiconductor device comprising:
a silicon carbide layer including an n-type region having an n conductivity type and a p-type region having a p conductivity type;
an electrode layer formed on the n-type region and the p-type region as being in contact with the n-type region and the p-type region; and
a coating layer formed on the electrode layer,
the electrode layer containing titanium, aluminum, silicon, and oxygen, and
aluminum and oxygen being present at an interface between the electrode layer and the coating layer, wherein
an atom concentration of aluminum in inside of the electrode layer is lower than an atom concentration of aluminum at the interface between the electrode layer and the coating layer,
an atom concentration of oxygen in inside of the electrode layer is lower than an atom concentration of oxygen at the interface between the electrode layer and the coating layer,
the coating layer is a barrier metal layer or a metal interconnection layer,
an average value of a thickness of the electrode layer is not smaller than 50 nm and not greater than 500 nm,
relation of $(T_{max}-T_{min})/T_{ave} \leq 1.0$ is satisfied, where $T_{max}$ represents a maximum value of the thickness of the electrode layer, $T_{min}$ represents a minimum value of the thickness of the electrode layer, and $T_{ave}$ represents the average value,
an atom concentration of carbon at an interface between the silicon carbide layer and the electrode layer is not higher than 10%, and
an average value of an atom concentration of carbon in inside of the electrode layer is not higher than 10%.

\* \* \* \* \*